US010185797B2

(12) United States Patent
Jaklic

(10) Patent No.: US 10,185,797 B2
(45) Date of Patent: Jan. 22, 2019

(54) METHODS AND DEVICES FOR EXTRACTION OF MEMS STRUCTURES FROM A MEMS LAYOUT

(71) Applicant: Cadence Design Systems, Inc., San Jose, CA (US)

(72) Inventor: Janez Jaklic, Neubiberg (DE)

(73) Assignee: Cadence Design Systems, Inc., San Jose, CA (US)

( * ) Notice: Subject to any disclaimer, the term of this patent is extended or adjusted under 35 U.S.C. 154(b) by 611 days.

(21) Appl. No.: 14/740,075

(22) Filed: Jun. 15, 2015

(65) Prior Publication Data

US 2016/0364515 A1 Dec. 15, 2016

(51) Int. Cl.
*G06F 17/50* (2006.01)

(52) U.S. Cl.
CPC ...... *G06F 17/5072* (2013.01); *G06F 17/5081* (2013.01)

(58) Field of Classification Search
CPC .................................................. B81C 99/006
See application file for complete search history.

(56) References Cited

U.S. PATENT DOCUMENTS

| 8,578,316 | B1 * | 11/2013 | Joshi | G06F 17/5018 716/110 |
| 2009/0144042 | A1 * | 6/2009 | Lorenz | G06F 17/5009 703/14 |
| 2012/0286903 | A1 * | 11/2012 | Prunnila | B81B 3/0072 333/234 |

OTHER PUBLICATIONS

Baidya et al., "An Extraction-Based Verification Methodology for MEMS", Journal of Microelectromechanical Systems, vol. 11, No. 1, Feb. 2002.*
Intellisense, "MEMS Extraction & verification", retrieved from https://www.slideshare.net/intellisense/mems-extraction-verification, published Feb. 2010.*
Bellam, S., et al., "An Efficient Geometric Algorithm for Extracting Structural Elements to Facilitate Automated MEMS Extraction", (This document contains the draft version of this paper.) ASME Journal of Computing and Information Science in Engineering, 3(2) :155-165, (2003), 39 pgs.

* cited by examiner

*Primary Examiner* — Vuthe Siek
*Assistant Examiner* — Aric Lin
(74) *Attorney, Agent, or Firm* — Schwegman Lundberg & Woessner, P.A.

(57) ABSTRACT

Electronic design automation systems and methods for extracting Microelectromechanical systems (MEMS) objects from a manufacturing MEMS layout are described for MEMS layouts directed to MEMS devices including mass and spring objects. Pattern recognition is used on a MEMS layer of the MEMS layout to identify beams and supports. The identified beams and supports are then used to derive a set of intermediate MEMS objects. The intermediate MEMS objects are used to derive a set of output objects, where the set of output objects includes at least two mass objects and at least one active spring object. The set of output objects may then be used to generate a Lagrangian model of the MEMS device described by the MEMS layout.

20 Claims, 32 Drawing Sheets

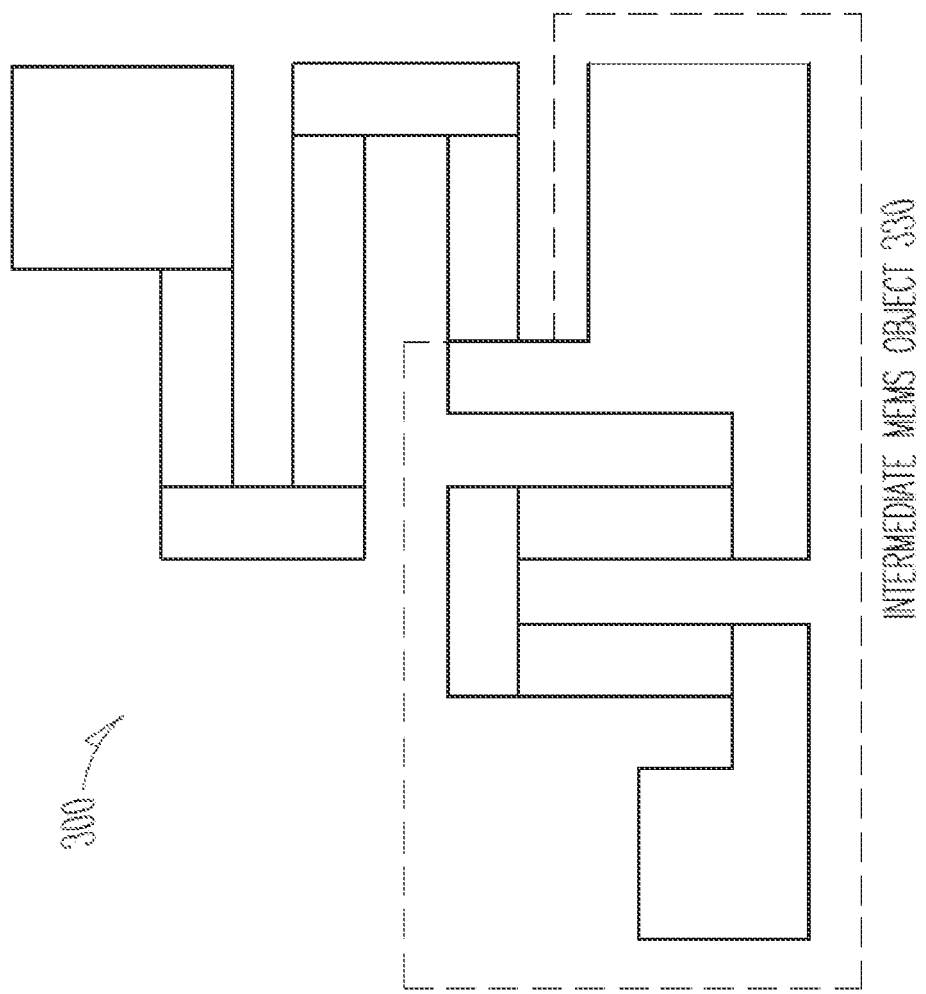

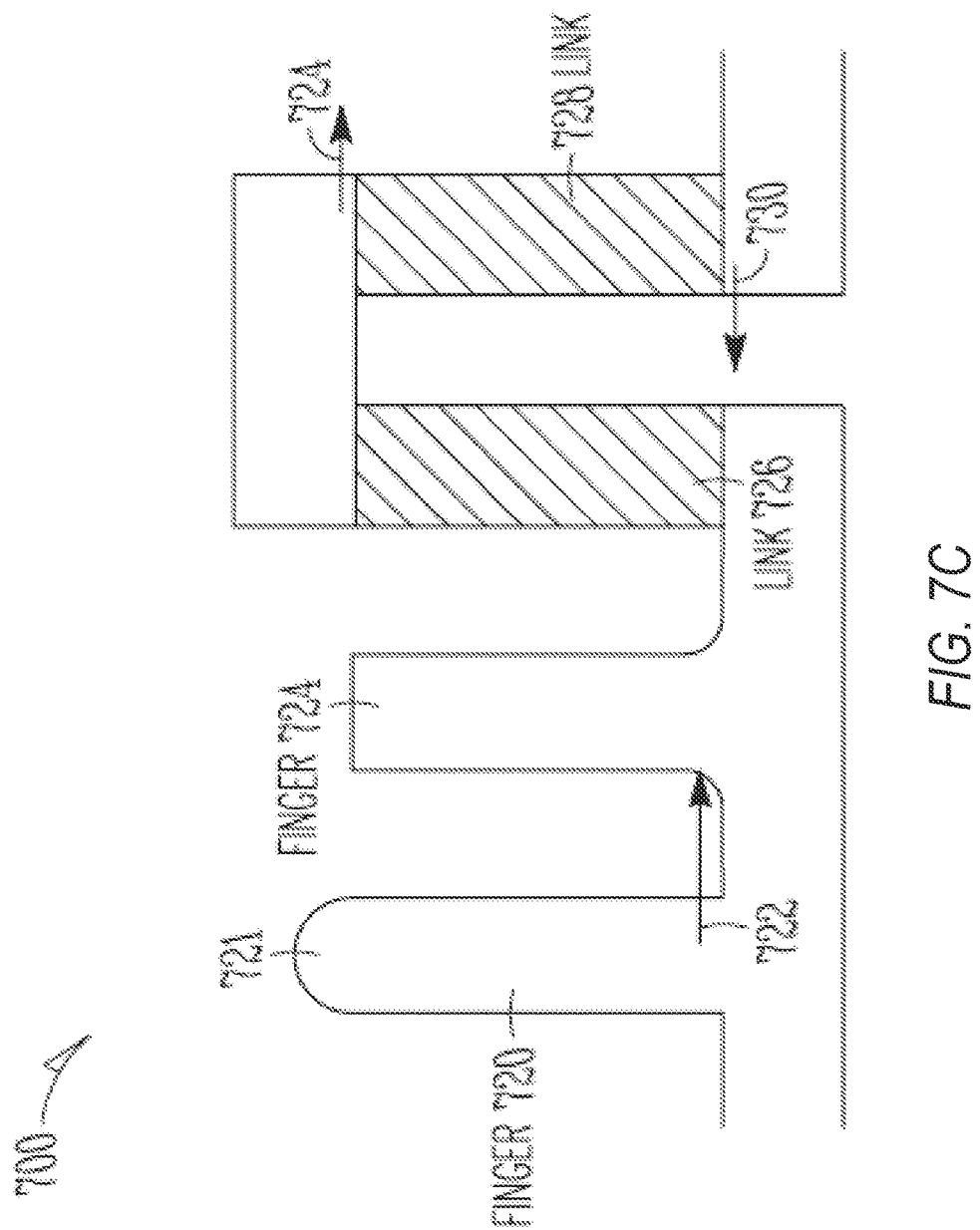

US 10,185,797 B2

METHODS AND DEVICES FOR EXTRACTION OF MEMS STRUCTURES FROM A MEMS LAYOUT

BACKGROUND

Electronic design automation is a category of systems for assisting with the design of electronic systems and devices. Such electronic design automation systems work in a design flow that allows system designers to create and analyze complex systems. Tools for device design, simulation, analysis, and verification are part of many electronic design automation systems.

Microelectromechanical systems (MEMS) is the technology of small devices with components roughly on the order of one to 100 micrometers. Different categories of MEMS exist with widely varying applications, including switching, biological lab-on-chip, microfluidics, accelerometers, or other systems. Although many MEMS systems are fabricated using manufacturing processes initially created for electronic integrated circuits, due to the differences with electronic integrated circuits and the complexity of MEMS, many of the systems for electronic design automation tools used for devices made up of transistors, resistors, and capacitors do not work well for MEMS design.

BRIEF DESCRIPTION OF THE DRAWINGS

Various ones of the appended drawings merely illustrate example embodiments of the present disclosure and should not be considered as limiting its scope.

FIGS. 3A-E illustrate aspects of extraction of MEMS structures from a MEMS layout according to some example embodiments.

FIGS. 7A-D are diagrams illustrating MEMS structures and aspects of MEMS structure identification and extraction from a MEMS layout according to some example embodiments.

DETAILED DESCRIPTION

Example embodiments described herein relate to methods and devices for extraction of MEMS objects from a MEMS layout. For example, in various implementations, such extraction may be performed as part of a larger electronic design automation tool, or the extraction may be implemented as a standalone system. The methods, devices and systems described herein may analyze MEMS layout data to identify basic MEMS elements of beams and supports, and then derive intermediate MEMS objects from these MEMS elements. Output mass and spring MEMS objects are then derived from the intermediate MEMS objects. Physical characteristics may then be associated with the output objects, and used to generate models describing the operation of the MEMS device described by the MEMS layout.

Some of the example embodiments described herein relate to a particular subset of MEMS devices, where many of the structures are in a single manufacturing layer, and where the operation is at least partially defined around the operation of largely rigid objects connected by flexible springs or beams. Examples of MEMS devices which belong to this subset of MEMS devices include, but are not limited to, gyroscopes, accelerometers, and pressure sensors. Reference to MEMS devices herein thus refers to the type of MEMS devices described above, and not to other classes of MEMS devices (e.g., mirror-based MEMS switches.)

In relevant MEMS devices, the identification of different functional structures in MEMS layout (e.g., comb drive and sensing fingers, springs, masses, frames, stoppers, etc.) is similar to the recognition of discrete devices in integrated circuit layout (e.g., transistors, diodes, capacitors, resistors, etc.), but with several crucial differences. Whereas integrated circuit devices are normally defined by the overlap of polygons from different layers, in relevant MEMS structures many or all MEMS objects exist on a single manufacturing layer. Also, unlike integrated circuit devices, which are separated from each other and connected by interconnect structures, MEMS structures can touch or overlap, making segmentation of a single MEMS layer into discrete MEMS objects more difficult. Finally, while integrated circuit devices can be recognized independently from other devices in a single step, MEMS objects may not be identifiable separate from their relation to other objects.

Figure 1:
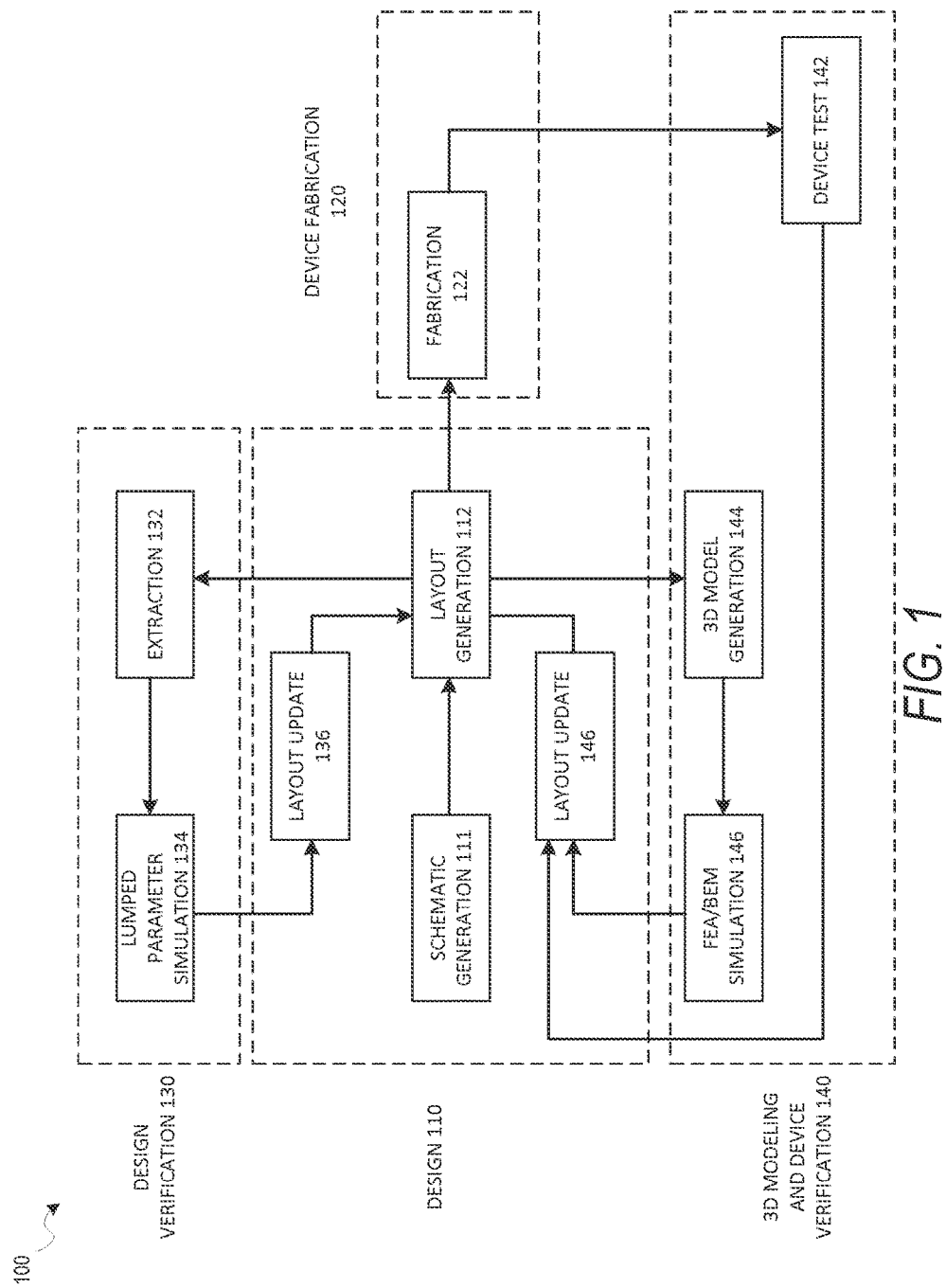
FIG. 1 is a diagram illustrating one possible design process flow including extraction of MEMS structures from a MEMS layout according to some example embodiments.

Processes for extracting MEMS objects from a MEMS layout may be useful as part of a design flow for creating a MEMS device. FIG. 1 is a diagram illustrating one possible design process flow 100 including extraction of MEMS structures from a MEMS layout according to some example embodiments. Design process flow 100 is one example process flow, and design process flow 100 as well as other different design process flows may all operate in accordance with the embodiments described herein. As illustrated, the overall design process flow 100 includes a design phase 110, a device fabrication phase 120, a design verification phase 130, and a device verification phase 140. The design phase 110 involves an initial schematic generation operation 111 where the basic elements and functionality of the MEMS device is determined. The schematic from schematic generation operation 111 is then used in a layout generation operation 112 to generate a MEMS layout that describes the physical layout dimensions of the MEMS device that match the schematic. This MEMS layout may then be used in a fabrication operation 122 to generate a MEMS device. Once the device is generated, the device can be tested as part of device test operation 142, and layout modifications generated based on actual device performance may be put into the MEMS layout as part of layout update operation 146.

Because of the high cost and delay associated with fabrication operation 122 and device test operation 142 in multiple revisions, three-dimensional models of MEMS layouts may be used to predict device performance using finite element analysis, boundary element method modeling, or other such physical modeling tools. This may involve generating a three dimensional (3D) model from the MEMS layout as part of 3D model generation operation 144 and finite element analysis (FEA)/boundary element method (BEM) simulation operation 144. In other embodiments, other types of 3D model simulations of a MEMS device may be used. These analyses may use the physical layout from layout generation operation 112 to model device performance, and layout updates from layout update operation 146 may be placed into the MEMS layout based on the results of these simulations. This type of analysis, however, does not identify MEMS elements or objects, and therefore may not accurately reflect the interactions between different parts of a MEMS layout.

Design verification phase 130, by contrast, operates to extract MEMS objects from a MEMS layout in extraction operation 132. The interactions between extracted MEMS objects may then be modeled using a lumped parameter simulation operation 134. These operations of design verification phase 130 supplement the device verification phase 140 by verifying that the component MEMS objects represented within a MEMS layout match an expected device design. Additionally, a lumped parameter simulation based on component MEMS objects of a MEMS device may provide additional insight into expected device operation beyond what is available solely from three dimensional models. Updates to a device may then be incorporated as part of layout update operation 136 providing feedback changes to a MEMS layout. After layout updates, extraction operation 132 can be followed by the LVS (layout versus schematic comparison) operation between the initial schematic and the extracted graph representation of the updated layout (see FIG. 13C) to verify their equivalence. Extraction operation 132 can also be followed by the DRC (design rule check) operation verifying different sets of design rules for different kinds of extracted MEMS objects.

As described above, in many embodiments, the M EMS objects represented by the MEMS layout generated by layout generation operation 112 are all drawn on the same manufacturing layer. This is at least in part because the fabrication process does not distinguish between the different MEMS objects in a single layer, and so the MEMS layout does not include this information. MEMS object identification from the MEMS layout by pattern recognition is impractical due to the variety of MEMS structures that may be part of a design. Embodiments described below thus use pattern recognition only for an initial identification of elemental beam objects, while the remaining non-beam objects are initially identified as support objects. Embodiments then use these beam and support objects to derive intermediate MEMS objects, and a set of output MEMS objects are derived from the intermediate MEMS objects. These output objects may be output as a netlist or an output MEMS layout. The output may then be compared against the expected design, may be used to verify object-specific design rules (e.g. minimum spacing between objects including the maximum amplitude of relative motion), and may also be used to generate a lumped parameter simulation, such as a simplified Lagrangian model of the MEMS device that predicts performance and movement of MEMS objects within an expected MEMS device. All movement discussed herein refers to movement in the plane of the MEMS layer.

Figure 2:
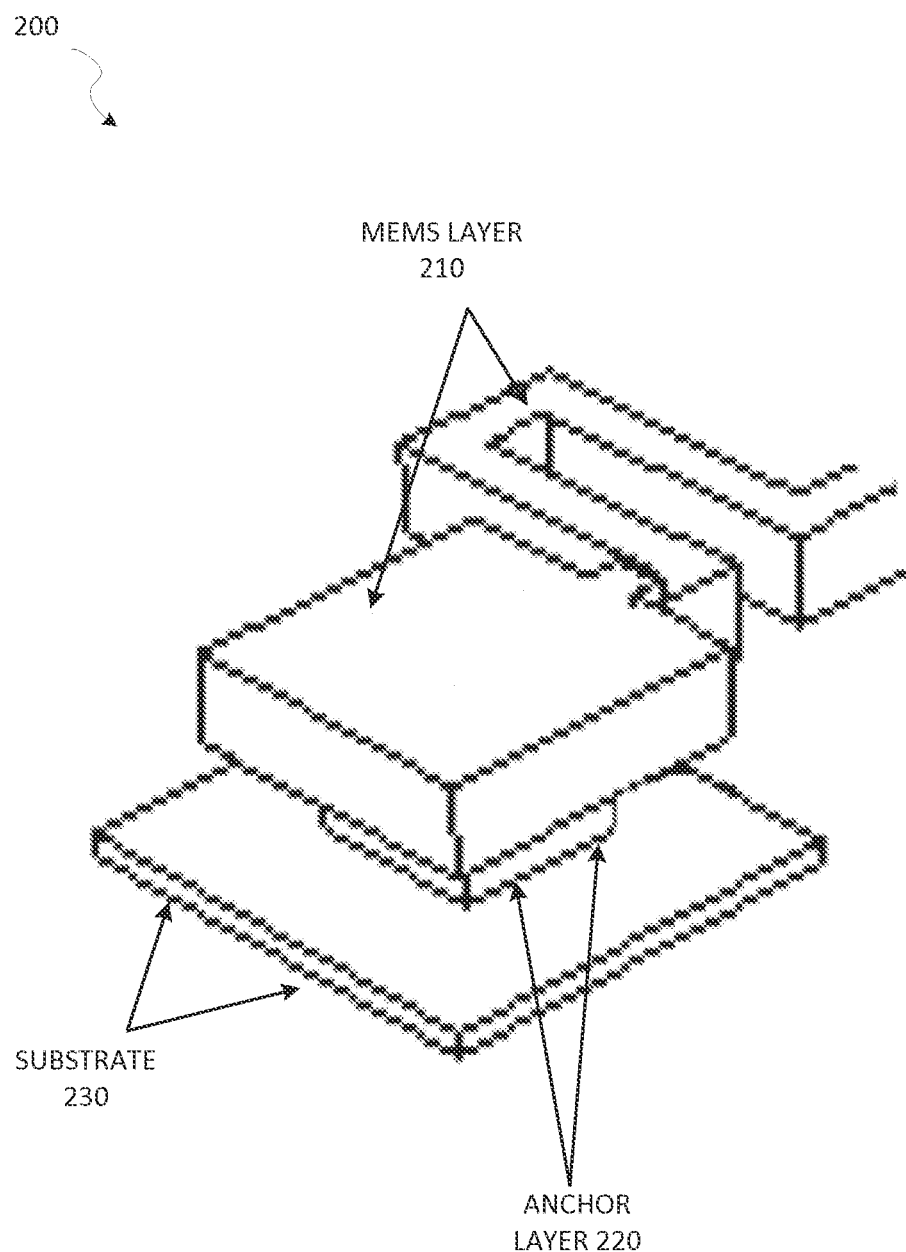
FIG. 2 is a diagram illustrating aspects of a MEMS device according to some example embodiments.

FIG. 2 is a diagram illustrating aspects of a MEMS device according to some example embodiments. FIG. 2 represents a portion of a MEMS device 200, and illustrates anchor objects in an anchor layer 220 on substrate 230, with MEMS objects in a MEMS layer 210 on top of the anchor object in anchor layer 220. A MEMS layout generated during an instance of MEMS layout generation operation 112 includes a two-dimensional top down representation of the MEMS object as part of a MEMS layer 210. The MEMS layout also includes a similar two-dimensional, top-down representation of the anchor objects from an anchor layer 220. MEMS objects and anchor objects in fabricated devices may be built in a fabrication process 122 using various combinations of lithography, etching, deposition, and micromachining processes. In order to identify any errors in the MEMS layout and to refine the design represented by the MEMS layout, a design verification phase 130 may be used.

Figure 3A:
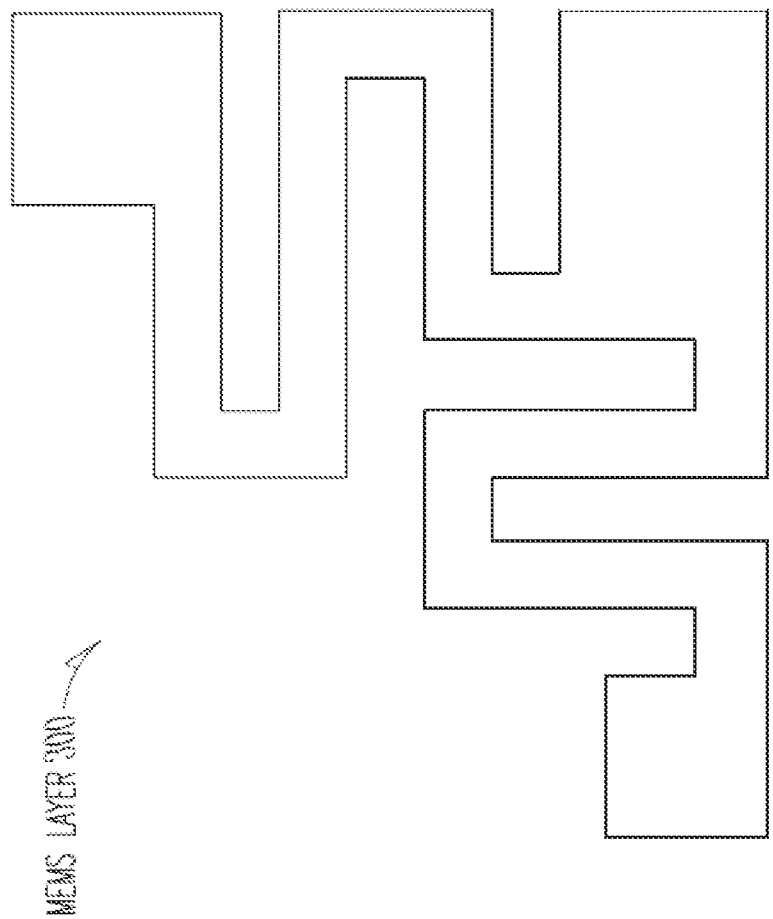
Figure 3B:
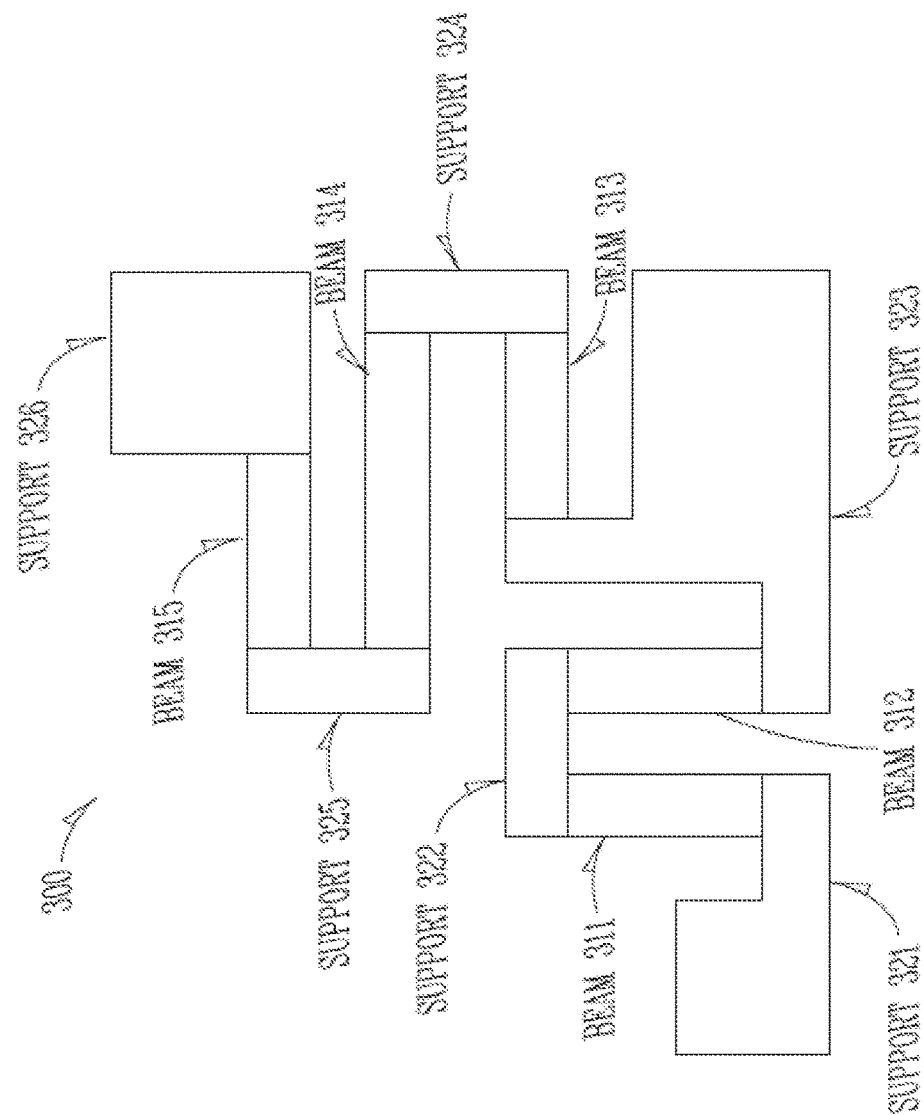

FIGS. 3A-E illustrates aspects of extraction of MEMS structures from a MEMS layer 300 according to some example embodiments. FIG. 3F illustrates one example embodiment of a model generated from MEMS structures extracted from a MEMS layout that includes MEMS layer 300) according to some example embodiments. FIGS. 3A-E may represent one example implementation of an extraction operation 132 of a design verification phase 130, with FIG. 3F illustrating an associated lumped parameter simulation generated by an instance of lumped parameter simulation operation 134. FIG. 4 describes one example method of extracting MEMS structures from a MEMS according to some embodiments. For the purposes of illustration, the method 400 of FIG. 4 is described in the context of the details of FIGS. 3A-F. It will be apparent that the method 400 may be applied to other MEMS layouts and devices in accordance with other embodiments not specifically detailed herein.

In association with some examples, some operations are described herein as analyzing one or more objects or groups of objects, identifying one or more objects from a different set of objects, or deriving one or more objects from a different set of objects. In accordance with some example embodiments, these may refer to a process of applying a set of logical operations or rules to a set of data representing part of a MEMS layout. Thus, data representing a first set of MEMS objects from a MEMS layout may be analyzed, segmented, parsed, or otherwise processed to identify or generate a new set of data representing another set of MEMS objects. Identification of a MEMS object may refer to both the process of applying a logical operation to a dataset representing the original MEMS objects from when a new MEMS object data representation is derived, as well as the act of creating and storing a new dataset representing the newly derived MEMS object in a memory.

The example embodiment method 400 of FIG. 4 begins with operation 402, which involves accessing, at an electronic design assistance (EDA) computing device, an input microelectromechanical system (MEMS) layout stored in memory of the computing device, the input MEMS layout defining a MEMS layer 300 and an anchor layer (not shown). The EDA computing device may be similar to machine 1500 of FIGS. 14 and 15, and may operate using a software architecture 1402. In other embodiments, other devices may be used. As illustrated by FIG. 3A, MEMS layer 300 of the MEMS layout merely identifies a geometry of a single design layer, although other information about MEMS layer 300 may be included in a data file for the associated MEMS layout.

Operation 404 involves analyzing, by the computing device, the MEMS layer 302 to partition the MEMS layer 302 into a plurality of MEMS elements 311-315 and 321-326, the plurality of MEMS elements comprising a plurality of beams 311-315 and a plurality of supports 321-326. Details of a pattern recognition embodiment for partitioning a MEMS layer into MEMS elements is discussed below in detail with respect to FIGS. 6 and 7A.

Figure 3D:
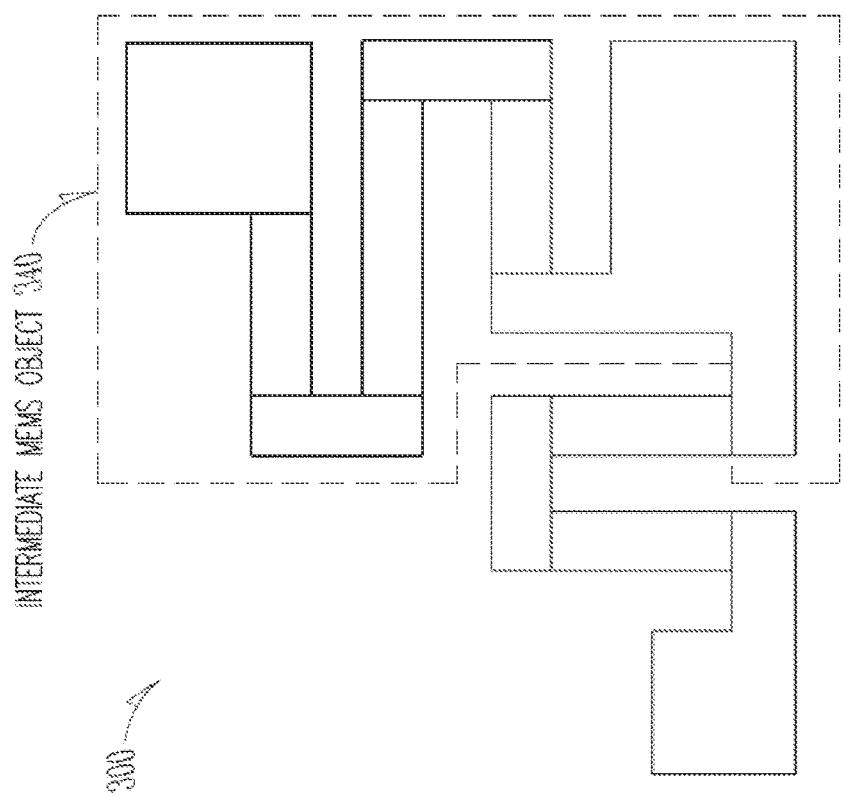
Figure 4:
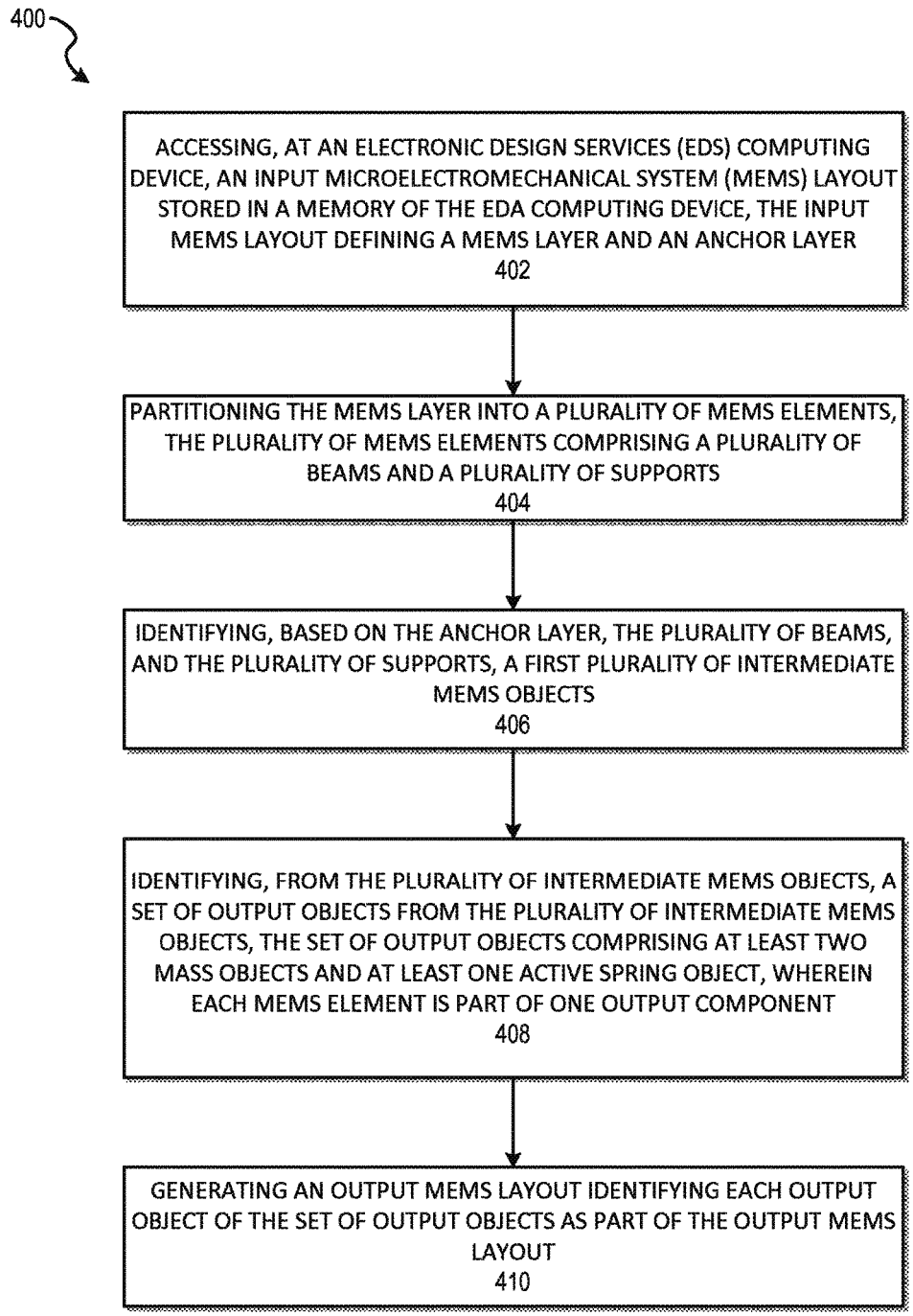
FIG. 4 describes one example method of extracting MEMS structures from a MEMS layout according to some embodiments.

Thereafter, as shown at Operation 406, involves the computing device may analyze the anchor layer, the plurality of beams 311-315, and the plurality of supports 321-326 to identify a plurality of intermediate MEMS objects 330 and 340 (e.g. objects illustrated by FIGS. 3C and 3D). Deriving multiple types of objects in multiple derivations layers allows the embodiment of method 400 to analyze different types of connections between MEMS elements and surrounding groupings of MEMS elements to identify the functional MEMS objects described by a MEMS layout that includes only geometry and no other description of functional blocks of MEMS objects. Various aspects and details related to intermediate MEMS objects and the derivation of such MEMS objects are described in more detail below with respect to FIGS. 5 and 7A-12.

Figure 3E:
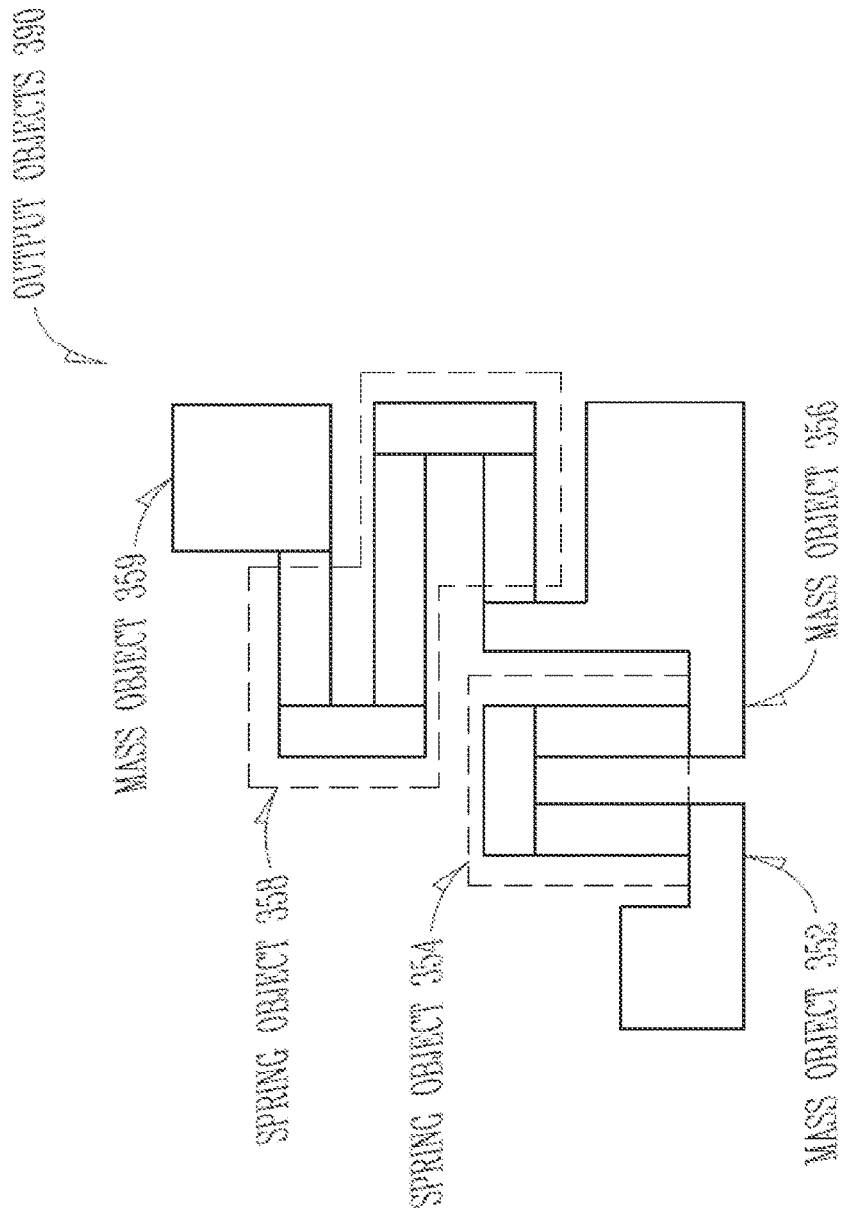
Figure 3F:
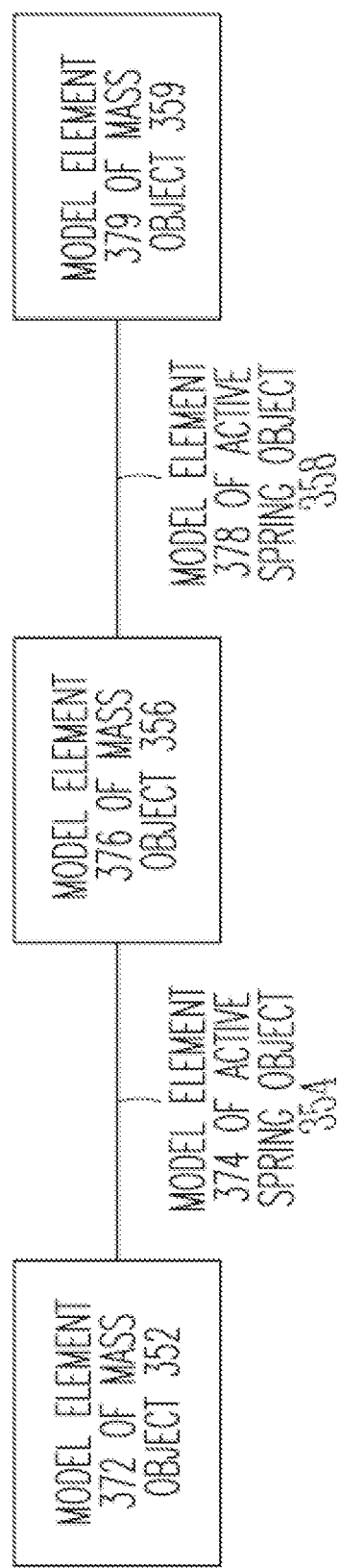
FIG. 3F illustrates one example embodiment of a model generated from MEMS structures extracted from a MEMS layout according to some example embodiments.

Operation 408 involves analyzing, by the computing device, the plurality of intermediate MEMS objects 330 and 340 to identify a set of output objects 390 from the plurality of intermediate MEMS objects 330 and 340. This analysis of intermediate MEMS objects 330 and 340 may, in embodiments with multiple levels of intermediate object derivations, include information from a previously derived MEMS object or a MEMS element that is associated with a derived MEMS object. In various different embodiments, the set of output objects 390 include at least two mass objects and at least one active spring object. Systems with only one mass object or with no spring objects will simply be identified as single support devices, with no functional interactions to be analyzed by embodiment systems for extracting MEMS output objects 390 from the MEMS layout 300. Every MEMS element will be assigned to an output object, as any disconnected or uncoupled objects will be identified as immobile support objects which have no interaction with other MEMS objects. As illustrated by FIG. 3E, output objects 390 includes three mass objects (352, 356, 359) and two active spring objects (354, 358), shown as mass object 352, mass object 356, mass object 359, active spring object 354, and active spring object 358.

Operation 410 involves generating an output MEMS layout identifying each output object of the set of output objects 390 as part of the output MEMS layout. This output may include a netlist, which is a simple listing of the output MEMS objects identified as component objects extracted from the MEMS layout and their connections to other MEMS objects. This output may include geometric information about each extracted MEMS object or other information about the position and connections for the extracted MEMS objects.

After the set of output objects 390 is identified, then a system may use this information to generate a lumped parameter simulation similar to lumped parameter simulation operation 134. This generates the simulation from the output MEMS objects by accessing a set of characteristic data associated with the MEMS layer 300 to get values needed for the simulation. This may include material properties and layer thickness details for the MEMS layer 300 that will impact mass values, spring constant values, and any other values important to a lumped parameter simulation of masses connected by springs in a MEMS environment. With this information, the set of output objects is analyzed to identify connections between the output objects of the set of output objects and to generate a model of each mass object and each spring object. The model of each output MEMS object and the connections between the output MEMS objects is then used in generating a simplified Lagrangian model for a lumped parameter simulation of the MEMS layout using the model of each mass object and each spring object.

FIG. 3F illustrates one example Lagrangian model for MEMS layout 300. The Lagrangian model of FIG. 3F includes mass models including model element 372 describing mass object 352, model element 376 representing mass object 356, and model element 379 describing mass object 359. The Lagrangian model also includes spring models including model element 374 representing active spring object 354 and model element 378 describing active spring object 358. The connections between the output objects 390 are also represented by the Lagrangian model, and the model may therefore be used to simulate the motion of the masses and springs under various input forces. In certain embodiments, for example, a movable MEMS object will include a comb structure that is interlaced with a comb structure of an anchored MEMS object. An electrical potential difference between the two comb structures may be used to exert a force on the movable MEMS object. Identifying such driving or sensing structures may be performed, in certain embodiments, by identifying pairs of comb structures that are near or interlaced, and which move relative to each other in one direction only. This information can be derived from the knowledge of possible directions of motion of each structure, which is one of the pieces of output information as described herein. A single comb structure can be identified as a group of parallel fingers connected to the same support. For such driving/sensing structures then special design rules can be verified, for example spacing rules at the maximum amplitude of motion. Details of the expected force input from such a MEMS structure may be integrated into a Lagrangian model as part of a device simulation. Such comb structures may be seen in the example MEMS layout 1300 of FIG. 13A, and lumped parameter simulation is described further below with respect to Lagrangian model 1395 that is associated with MEMS layout 1300.

As described above, embodiments herein include methods by which high-level mechanical structural elements of a MEMS device and a model of their interconnections can be automatically extracted from the layout data for a M EMS structural layer using a set of derivation rules. The methods described herein include improvements over previously known methods in that the embodiments described herein can be used in the analysis of both Manhattan layout geometries (e.g., all objects are rectangles and all edges have a vertical or horizontal orientation) and non-Manhattan geometries. Non-Manhattan layout geometries may be analyzed using the embodiments herein because there is no orientation limitation on the placement of rectangles, and because non-rectangular objects may be analyzed using various derivation rules described herein.

Additionally, some embodiments described herein include an advantage of being directly expressible in the RAVEL computer instruction language in a way that can be automatically executed on real layout data in a Graphic Database System format (e.g., GDSII). GDSII is a database file format which is used for exchange of circuit layout artwork representing planar geometric shapes, text labels, and other information about a layout in hierarchical form. This includes MEMS layouts as discussed herein, which may be processed by various embodiment systems with the MEMS layout in a GDSII format. Embodiments implemented using RAVEL computer instructions include additional benefits of the ability to be integrated with existing EDA tools and systems, such that the MEMS object extraction and associated modeling may be automatically integrated with existing tools related to other operations or design phases as described in the example design flow of FIG. 2 or in other design flows for creating and optimizing a MEMS device.

In various embodiments, the input layout is assumed to consist of two polygon layers, including a MEMS layer, representing at least some movable MEMS structures above the substrate, and an anchor layer, representing anchoring of MEMS structures to the substrate, as illustrated in the example MEMS device 200 of FIG. 2. Each layer consists of a set of data representing disjoint (e.g., non-overlapping, non-adjacent) polygons. Geometrical pattern recognition is used on the polygons on the MEMS layer to partition the polygons of the MEMS layer into a set of rectangles with a certain minimum aspect ratio called beams or beam objects, and a set of remaining areas called supports or support objects. Beams and supports represent a basic type of MEMS object called a MEMS element. For these basic MEMS elements of a layout, the area, width, and long axis of each beam is determined; an area of each support is determined, and supports adjacent to each end of each beam (of which there can be zero or one) are determined.

In such embodiments, in the subsequent steps after determination of the MEMS elements, new types of objects are defined and derived. These "intermediate" objects may be a connected group of disjoint adjacent elements, covering a single connected region or a general group of elements, which may not be mutually adjacent or disjoint. All objects of the same type constitute a set, which can be one of the following: a set of disjoint connected groups of elements (e.g., objects) where different objects are disjoint; a set of connected objects, where different groups may not be disjoint; or a general group of elements. New types of MEMS objects are derived from the sets of previously defined types of objects or elements by the following operations: an addition operation, where the resulting set contains all elements contained in the input sets; a subtraction operation, where the resulting set contains all elements of one input set, except for the elements contained in the other input sets; a selection operation, where the resulting set is a subset of the input set, containing elements that satisfy the selection criteria involving their properties and/or their relation to the elements in other sets; a grouping operation, where the resulting set contains general groups of elements that were formed from the elements of the input sets according to the selection criteria involving the properties of the elements and/or a relation of the derived elements to the elements in other sets; or any combination of the above operations.

In such an embodiment, the various derivation operations function to partition the MEMS layout into different rigid networks and the flexible connections (e.g., springs made up of at least one beam) that connect these rigid networks. Although different derived MEMS structures can contain a number of beams, their motion may be restricted such that the structure as a whole behaves rigidly when force is applied to it in a certain direction. FIGS. 3C and 3D show two examples of rigid MEMS structures: intermediate MEMS object 330 (3C) and intermediate MEMS object 340 (3D). These are the simplest structure of this kind, defined as groups of parallel beams connected by supports. Each rigid network derived from other elements and objects can consist of an arbitrary number of beams and supports, some of which can also belong to different rigid networks.

The partitioning of a MEMS layout in different rigid networks allows further restrictions and characterizations of motion of the structures to be found. For example, a beam requires a pair of opposite vertical forces acting on it at both ends in order to bend. However, if both ends of a beam are connected to the same network, which behaves rigidly when the force is applied in a direction that would otherwise bend the beam, the beam is effectively restrained from bending and can be considered as part of a single rigid network object. In another context, a beam with the same dimensions and characteristics may act differently based on the connections of elements around the beam.

For various automatic execution embodiments, MEMS structure extraction is implemented in a set of computer-readable instructions. Many existing languages used for integrated physical verification tools are not sufficiently powerful for this purpose due to limitations on the data used to represent objects in a layout. Some embodiments described herein thus use an instruction language that can represent complex data structures by tuples of objects in relationships.

One specific example embodiment of deriving intermediate MEMS object 330 and intermediate MEMS object 340 from MEMS layer 302 is described. The example operations are performed on sets of tuples (e.g., finite ordered lists) of objects of the same type, called relations, by a small number of operators forming a relational algebra including operators performing transitive closure and aggregation of tuple objects in collections. A tuple as discussed below is thus a finite ordered list of MEMS objects of particular MEMS objects types. A relation as discussed below is thus a set of such tuples containing MEMS objects of the same MEMS object types. After beam objects are identified using pattern recognition and support objects are identified as the remainder of the layout after the subtraction of the beams, the identified beams 311-315 and supports 321-326 are defined within the implementation instructions as relations containing all beams and supports in tuples of order one. A relation named beam is defined as a set of tuples {(311), (312), (313), (314), (315)}, and a relation named support is defined as a set of tuples {(321), (322), (323), (324), (325), (326)}, where ( ) denotes a tuple and { } denotes a set. The example below illustrates the use of these relations beam and support to derive a new relation named rigidNetwork in which each tuple contains a collection of rigidly connected beam and support objects.

From the relations beam and support, first a new relation supportBeams is derived as a set of all possible tuples containing one support object and two beam objects. In RAVEL language this derivation may be implemented as:
 (define supportBeams (combine support beam beam))
For the example embodiment, the relation supportBeams is a set of 150 tuples of order three of the form $(s, b_1, b_2)$, where s can be any of the support objects 321-326, $b_1$ can be any of the beam objects 311-315 and $b_2$ can also be any of the beam objects 311-315, either equal or non-equal to $b_1$.

Then a new relation supportDirectlyConnectedBeams is derived as a subset of those tuples $(s, b_1, b_2)$ from the relation supportBeams where the two beam objects $b_1$ and $b_2$ in the tuple are parallel, not equal and adjacent to the support object s. In RAVEL language this derivation may be implemented as:

```
(define supportDirectlyConnectedBeams
    (select (s b1 b2) supportBeams
        (and (parallel? b1 b2)
             (not (equal? b1 b2))
             (adjacent? s b1)
             (adjacent? s b2))))
```

Here "s", "b1" and "b2" are arbitrarily chosen names by which the support object and the two beam objects in each tuple are referred to in the predicate functions such as "parallel?", "equal?" and "adjacent?". For the example embodiment, the relation supportDirectlyConnectedBeams is a set of six tuples of order three: {(322,311,312), (322,312,311), (324,313,314), (324,314,313), (325,314,315), (325,315,314)}.

Next a new relation directlyConnectedBeams containing pairs of different parallel beams directly connected by same support is derived from the relation supportDirectlyConnectedBeams by transforming each tuple $(s, b_1, b_2)$ of order three to a tuple $(b_1, b_2)$ of order two with the support object s removed. In RAVEL language this derivation may be implemented as:

```
(define directlyConnectedBeams
    (transform (s b1 b2) supportDirectlyConnectedBeams
        (b1 b2)))
```

Here again s, b1, b2 are arbitrarily chosen names by which the input tuple objects can be referred in the specification of the output tuple objects (b1 b2). For the example embodiment, the relation directlyConnectedBeams is a set of six tuples of order two: {(311,312), (312,311), (313,314), (314,313), (314,315), (315,314)}.

Then a new relation connectedBeams containing all pairs of parallel beams that are connected either directly or indirectly through other beams is derived from the relation directlyConnectedBeams by transitive closure, whereby the input relation is augmented with additional tuples such that if the input relation contains a chain of tuples $(b_1, b_2)$, $(b_2, b_3)$, ..., $(b_n, b_{n+1})$, with n>1, then the output relation in addition also contains all possible tuples $(b_i, b_j)$, where i,j=1, ..., n+1. For the example embodiment, where the input relation directlyConnectedBeams contains tuples (313,314) and (314,315), this means that the output relation connectedBeams also contains tuple (313,315). In RAVEL language this derivation may be implemented as:

```
(define connectedBeams
    (augment directlyConnectedBeams))
```

For the example embodiment, the relation connectedBeams is a set of thirteen tuples of order two: {(311,311), (311,312), (312,311), (312,312), (313,313), (313,314), (313,315), (314,313), (314,314), (314,315), (315,313), (315,314), (315,315)}.

Next a new relation connectedBeamsBeam with each tuple containing a collection of connected parallel beams and one of the beams from the collection is derived from the relation connectedBeams by contracting all input tuples $(b_i, b)$ sharing the same second beam object b to a single output tuple $([b_i], b)$, in which all first beam objects $b_i$ have been aggregated in the collection $[b_i]$. In RAVEL language this derivation may be implemented as

```
(define connectedBeamsBeam
    (contract bi (bi b) connectedBeams))
``` where bi and b are arbitrary names used to refer to the two beam objects in each tuple and bi specifying the objects that are aggregated in collections. For the example embodiment, the relation connectedBeamsBeam is a set of five tuples {([311,312], 311), ([311,312], 312), ([313,314,315], 313), ([313,314,315], 314), ([313,314,315], 315)}, where [ ] denotes a collection.

In the next step a relation connectedBeamsSupport is derived by combining each tuple of the form $([b_i], b)$ from the relation connectedBeamsBeam with each tuple of the form (s) from the relation support, selecting only those resulting tuples of the form $([b_i], b, s)$ where the beam b and the support s are adjacent, and transforming the remaining tuples to the tuples of form $([b_i], s)$ from which the beam b has been removed. In RAVEL language this derivation may be implemented by nesting of the three operations as:

```
(define connectedBeamsSupport
    (transform (cb b s)
        (select (cb b s) (combine connectedBeamsBeam support)
            (adjacent? b s))
        (cb s)))
```

Here cb, b, s are arbitrary names used to refer to the collection of beam objects, the beam object and the support object, respectively, in each tuple. For the example embodiment, the relation connectedBeamSupport is a set of seven tuples {([311,312],321), ([311,312],322), ([311,312],323), ([313,314,315],323), ([313,314,315],324), ([313,314,315], 325), ([313,314,315],326)}.

Finally a relation rigidNetwork with each tuple containing a collection of rigidly connected beam and support objects is derived from the relations connectedBeamsBeam and connectedBeamsSupport in three steps. In the first step, these two input relations are merged to produce a new relation containing tuples of the form $([b_i], e_j)$, where $[b_i]$ denotes a collection of beams and $e_j$ denotes an element type object, which is either a beam type object or a support type object. In the second step, all resulting tuples of the form ([b$_i$],e$_j$) sharing the same collection [b$_i$] are contracted to a single tuple of the form ([b$_i$],[e$_j$]), where the element objects e$_j$ have been aggregated in the collection [e$_j$]. In the last step, the collection of beams [b$_i$] is removed from each tuple, producing tuples that contain only the collection of rigidly connected elements ([e$_j$]). In RAVEL language the three steps of the derivation may be implemented in nested form as:

```
(define rigidNetwork
    (transform (cb ce)
        (contract ej (cb ej)
            (union connectedBeamsBeam
                   connectedBeamsSupport))
        (ce)))
```

Here names cb, ej, ce have been chosen arbitrarily to refer to the collection of beam object, the element object and the collection of element objects, respectively, in each tuple. For the example embodiment, this results in the relation containing two tuples ([311,312,321,322,323]) and ([313,314, 315,323,324,325,326]), corresponding to both rigid networks. As can be seen from FIGS. 3B, 3C, and 3D, tuple ([311,312,321,322,323]) represents intermediate MEMS object 330, and tuple ([313,314,315,323,324,325,326]) represents intermediate MEMS object 340. Similar derivations can then be used to derive the MEMS output objects 390 from the tuples associated with intermediate MEMS object 330 and intermediate MEMS object 340.

Figure 5A:
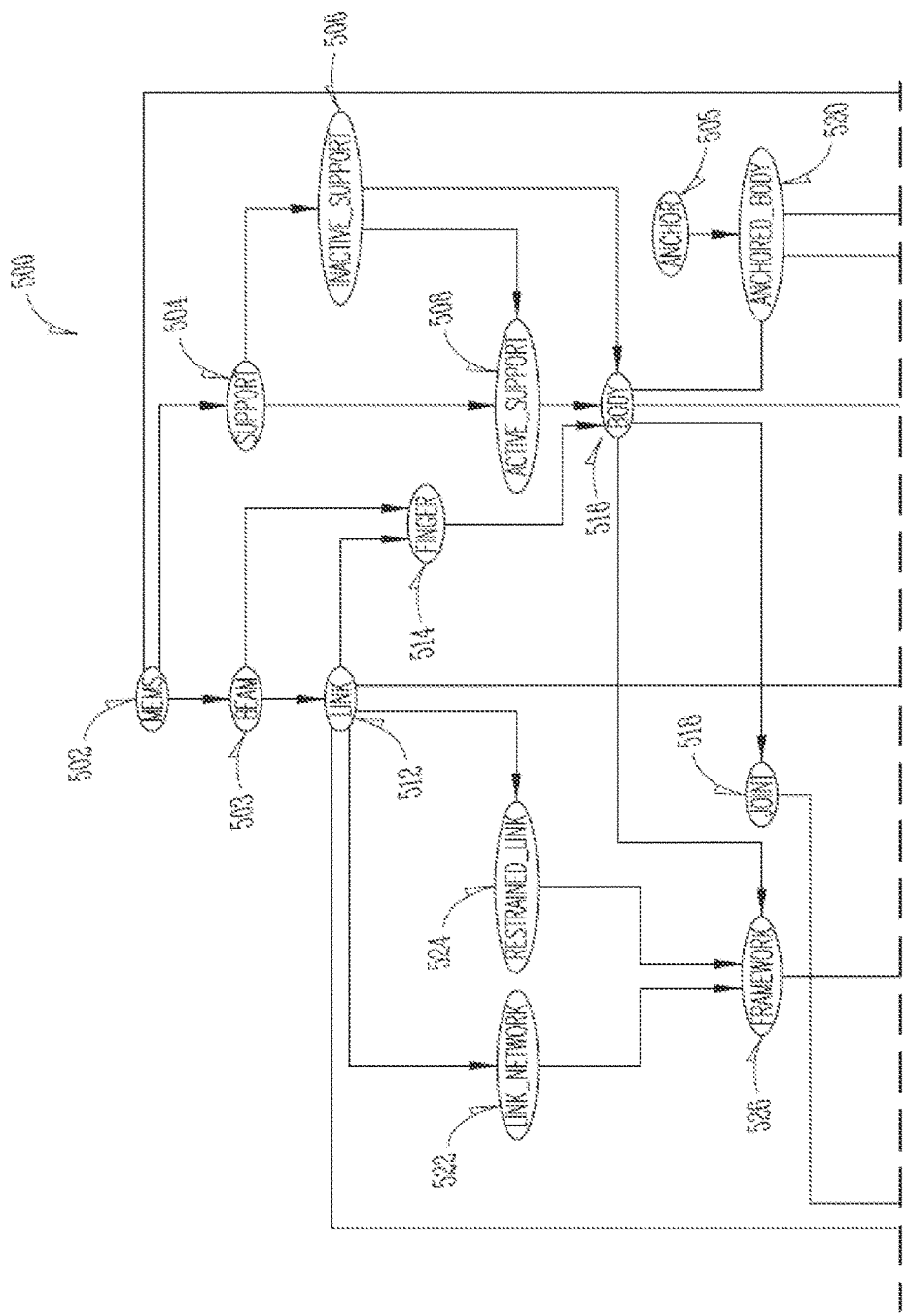
FIGS. 5A-5B are a joint diagram illustrating aspects of deriving MEMS objects from a MEMS layout according to some example embodiments.
Figure 5B:
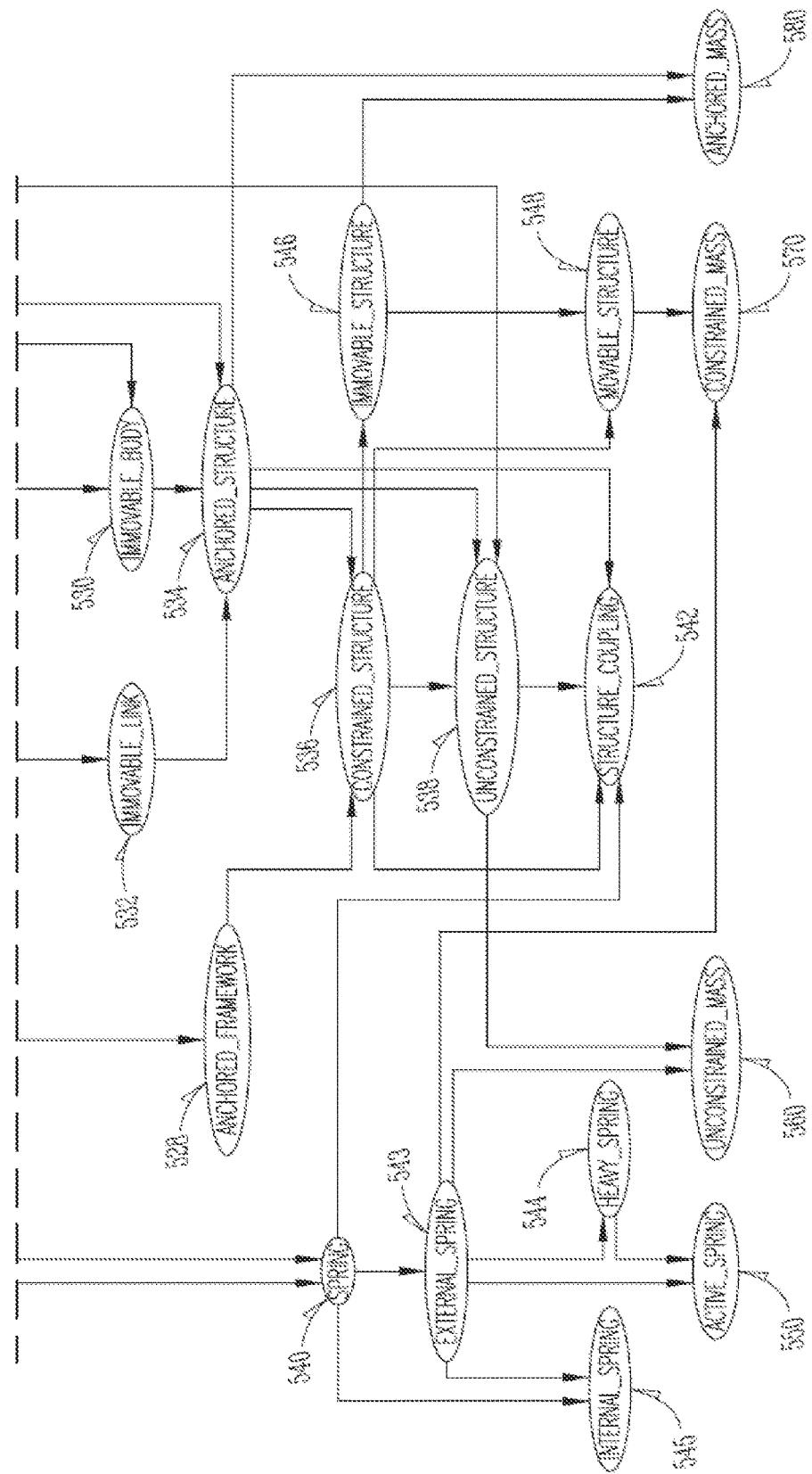

FIGS. 5A-5B are a joint diagram illustrating aspects of deriving MEMS objects from a MEMS layout according to some example embodiments. FIG. 5A has a broken line at the bottom indicating a continuation of the diagram onto the broken line at the top of FIG. 5B.

FIGS. 5A-B show an object derivation graph 500 which is an overview of different types of MEMS objects and how they are derived from the MEMS layer 502, the anchor layer 505, and previously defined ones of the MEMS objects, in one example embodiment. FIGS. 5A and 5B illustrate simplified derivation details, where objects may be derived not only from the immediately connected objects above the derived object, but also in consideration of any previous objects. Specific details of derivation embodiments for different types of MEMS objects with examples and discussion of how the objects may be identified and/or derived follows in the discussions of FIGS. 6-12.

Object derivation graph 500 shows MEMS layer 502 and anchor layer 505, which are used as the initial inputs from which other MEMS objects are derived. Beam objects 503 and support objects 504 are derived as discussed above and as discussed in more detail with respect to FIGS. 6 and 7A below. Inactive support 506 and active support 508 are as discussed with respect to FIG. 7B below. Link objects 512 and finger objects 514 are derived as discussed with respect to FIG. 7C below. Body objects 516 and joint objects 518 are derived as discussed in respect to FIG. 7D below. Anchored body objects 520 are derived as described with respect to FIG. 8 below. Link networks 522 are derived as described with respect to FIG. 9A below. Restrained link objects 524 are described below with respect to FIG. 9B. Framework objects 526 are described below with respect to FIG. 9C. Anchored framework objects 528 are discussed below with respect to FIGS. 10A and 10B. Immovable body objects 530 are described below with respect to FIG. 10C. Immovable link objects 532 are described below with respect to FIG. 10D. Anchored structure objects 534 are described below with respect to FIG. 10E and FIG. 11A. Constrained structure objects 536 are described below with respect to FIG. 11B. Unconstrained structure objects 538 are described below with respect to FIG. 11C. Spring objects 540, external spring objects 543 and internal spring objects 545 are described below with respect to FIG. 11D. Structure coupling objects 542 are described with respect to FIGS. 11E and 11F. Movable structure objects 548, immovable structure objects 546 and heavy spring objects 544 are described below with respect to FIG. 12 as well as previous figures. Active spring objects 550, unconstrained mass objects 560, constrained mass objects 570, and anchored mass objects 580 are part of a set of output MEMS objects. These output MEMS objects are described in more detail below with respect to FIGS. 11G and 13B.

In various embodiments, the objects above, which are parts of object derivation graph 500, may be considered object types as discussed above with respect to the implementation example discussed for FIG. 3. Each of these objects may, in such embodiments, be associated with a derivation operation that is defined by a set of derivation operations in an implementation system. When a MEMS layout is received, the MEMS layer 502 and the anchor layer 505 are run through an object recognition process to identify the base MEMS elements and anchor objects, and then the derivation operations are used to derive objects as described by object derivation graph 500 using the specific derivation operations described by the computer-readable instructions of the specific implementation. These derivation operations will result in the set of output objects, which will include at least two mass objects selected from unconstrained mass object 560, constrained mass object 570, and anchored mass object 580. At least one anchored mass object may also be specified in some embodiments in order to provide a supporting connection to anchor layer 505 and the supporting substrate for the device described by MEMS layer 502. The set of output objects will also include at least one object from active spring objects 550. If no active spring object 550 is present, then an embodiment MEMS object extraction system will simply recognize one solid anchored mass with no functional operation that is identifiable by the system.

Figure 6:
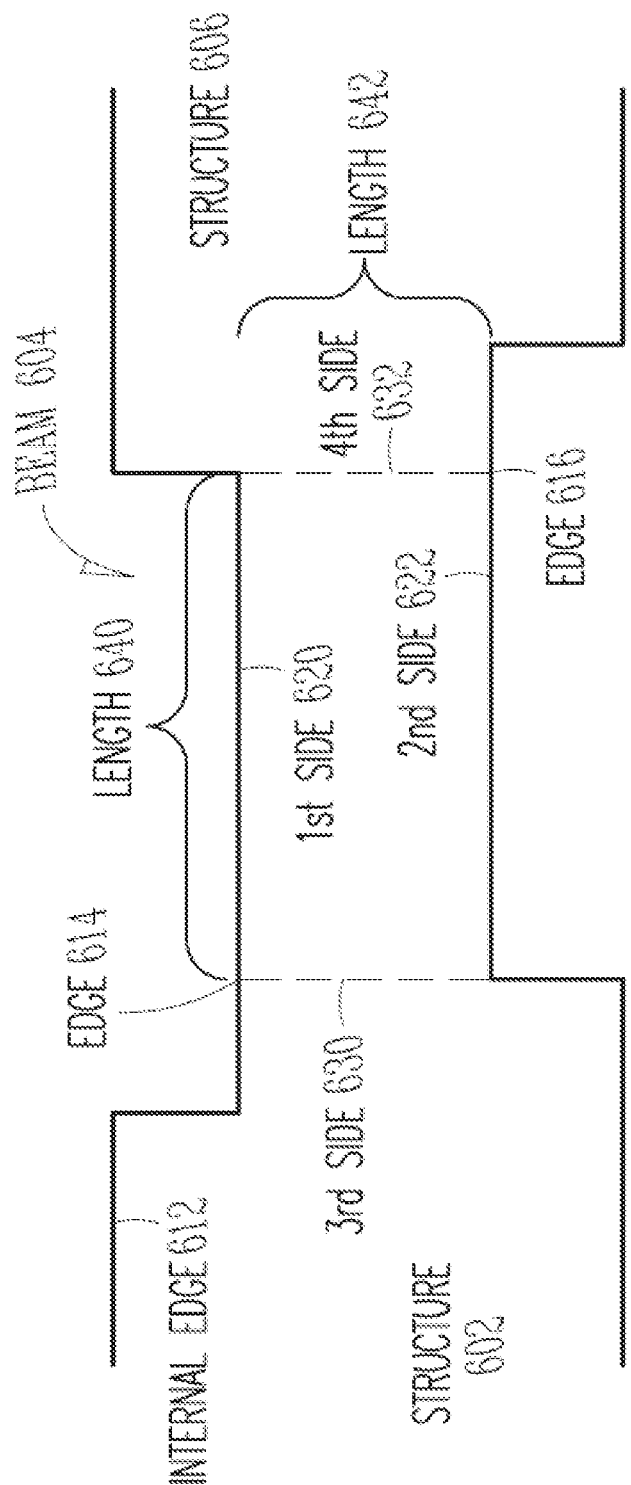
FIG. 6 is a diagram illustrating aspects of a beam and beam identification from a MEMS layout according to some example embodiments.

FIG. 6 is a diagram illustrating aspects of a beam and beam identification from a MEMS layout according to some example embodiments. FIG. 6 shows a beam object 604 attached at each end to a different structure object, shown as structure object 602 attached to beam object 604 at third side 630 and structure object 606 attached to beam object 604 at fourth side 632. The lines illustrated in FIG. 6 are representations of geometric data from a MEMS layout, which defines the areas in a MEMS layer where material that is part of the MEMS device will be after device manufacturing. An internal edge of each line is the side of the line where the material in the MEMS device is to be, and an opposite external edge will be air or an inert space that will not impact the function of the MEMS device.

Figure 7A:
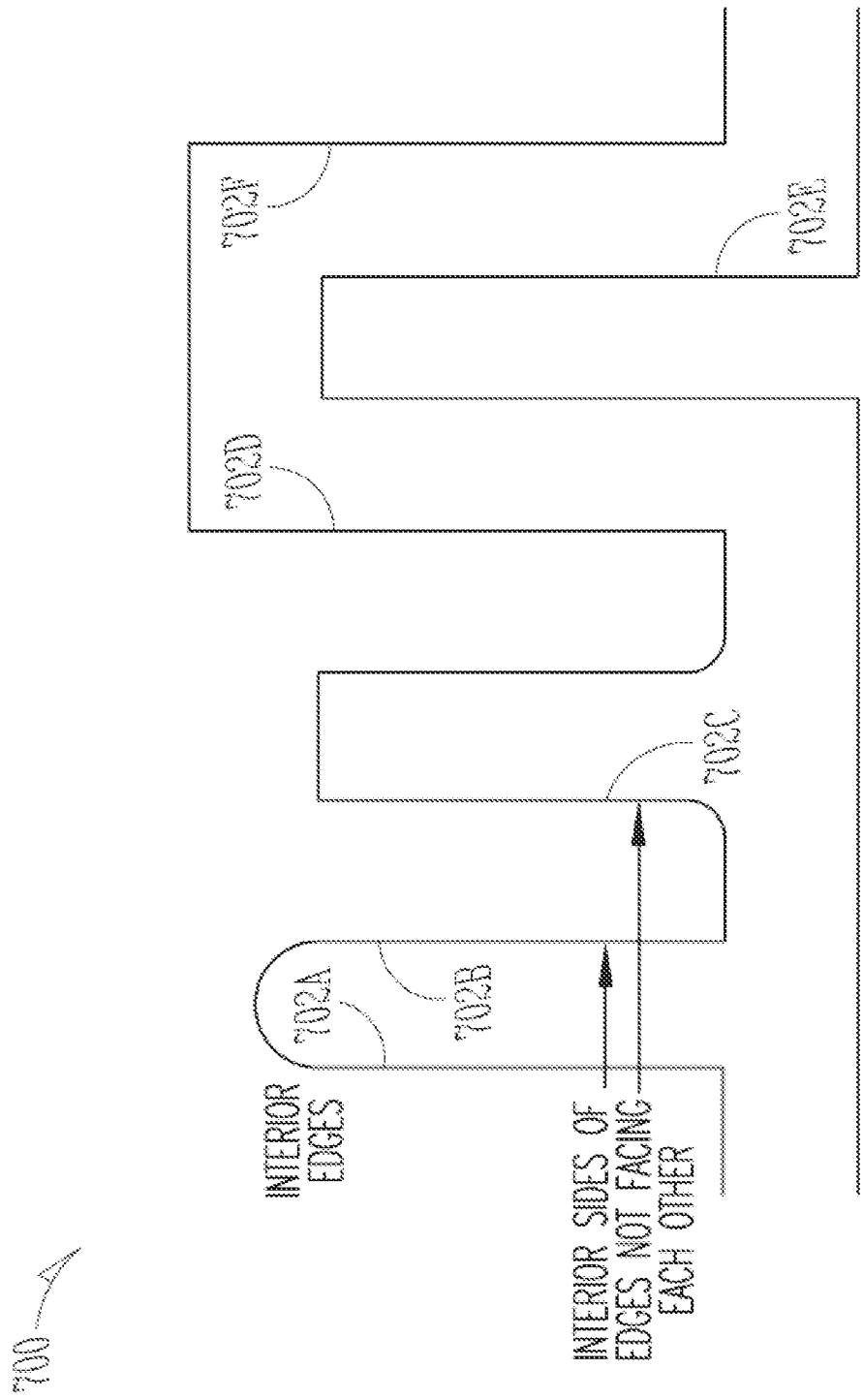

As described above, when a MEMS layout is received for processing as part of a design verification phase including MEMS object extraction, the lines that define the geometry in the MEMS layer are identified as MEMS object edges with internal and external edges. A pattern recognition process is used on the lines to identify beam structures by polygon partitioning. A beam object is identified by finding polygons in the MEMS layer which meet the following characteristics, which for the purposes of this example are described using the elements of FIG. 6 and FIG. 7A. A beam object is: (1) a rectangle that does not overlap with any anchor object of the anchor layer. Coordinates in the MEMS layout may be used to identify where any object in the MEMS layer overlaps with an object in the anchor layer. The four sides of the beam object 604 are illustrated as first side 620, second side 622, third side 630, and fourth side 632. (2) The first side 620 and the second side 622 are orthogonal projections of two MEMS object edges or lines from the MEMS layer onto each other. This means that the edges are parallel, and they include only the portion of each edge that corresponds to part of the other edge directly opposite to each edge, with the two edges shown as edge 614 and edge 616. In FIG. 6, a leftmost portion of edge 614 is not part of first side 620 and a rightmost portion of edge 616 is not part of second side 622 because these portions of the edges do not project onto the other edge. (3) The lines corresponding with the edges of the beam are the closest pair of internal edges with respect to each other, meaning that they are facing each other when looking towards the interior of the MEMS layer. FIG. 7A is a diagram illustrating a MEMS structure and aspects of MEMS structure identification and extraction from a MEMS layout according to some example embodiments. As can be seen in FIG. 7A, edges 702A and 702B are a pair of closest internal edges with respect to each other. Edges 702B and 702C are closest edges, but are not internal with respect to each other, and therefore would not be part of a single beam object together. Edges 702D and 702F are internal edges with respect to each other, but they are not the closest internal edges, as edge 702E is between edges 702D and 702F. Edges 702E and 702F are a pair of closest internal edges with respect to each other, and so would meet this requirement. (4) A length ratio of a side of the beam object 604 along an edge (e.g., first side 620 or second side 622 having length 640) with respect to an internal side (e.g. third side 630 or fourth side 632 having length 642) is greater than a minimum beam aspect ratio. In the embodiment of FIG. 6, this value would be (length 640/length 642.) This minimum beam aspect ratio may be defined by the MEMS layout, may be a characteristic defined in the software performing the design verification, may be a user entered value, may be dependent on the material to be used to generate the device, or may be set in any other such fashion. In various embodiments, this ratio may be set to insure that beam object 604 is capable of bending such that the MEMS device operation will depend on the beam object 604 bending. In other embodiments, this ratio threshold may be inverted to be a maximum ration of the interior side to the edge side of beam object 604, or any other similar analysis or characteristic may be used to determine that the object identified as a beam is capable of bending given the appropriate forces and surrounding structures.

After all of the MEMS object lines and edges in a MEMS layout have been analyzed to identify all present beam objects that meet the above described thresholds, the remaining polygons are defined as support objects. The set of support objects and the set of beam objects for a particular MEMS layout is thus a set of MEMS elements which describes the entire MEMS layer of a MEMS layout.

Figure 7B:
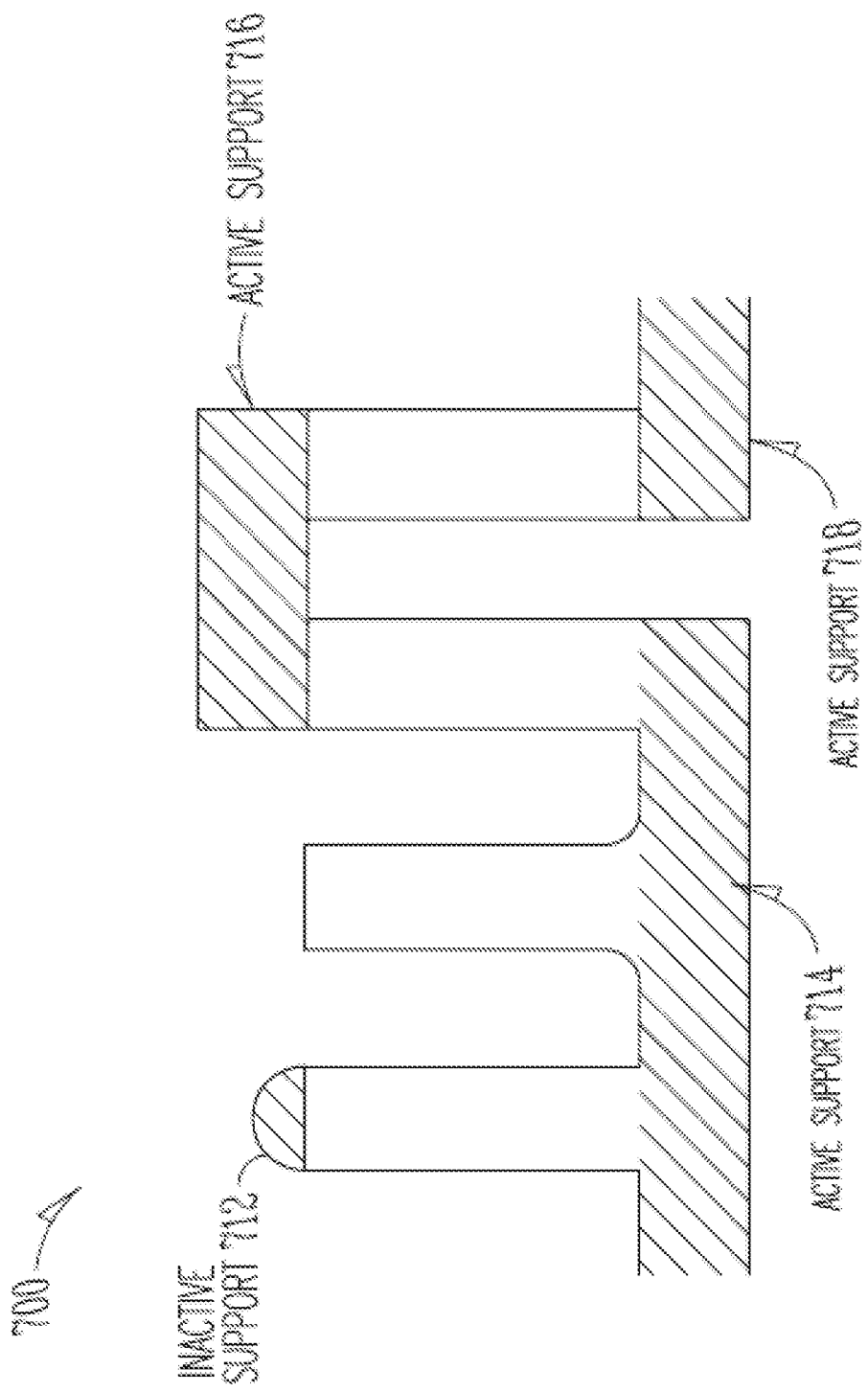
Figure 7D:
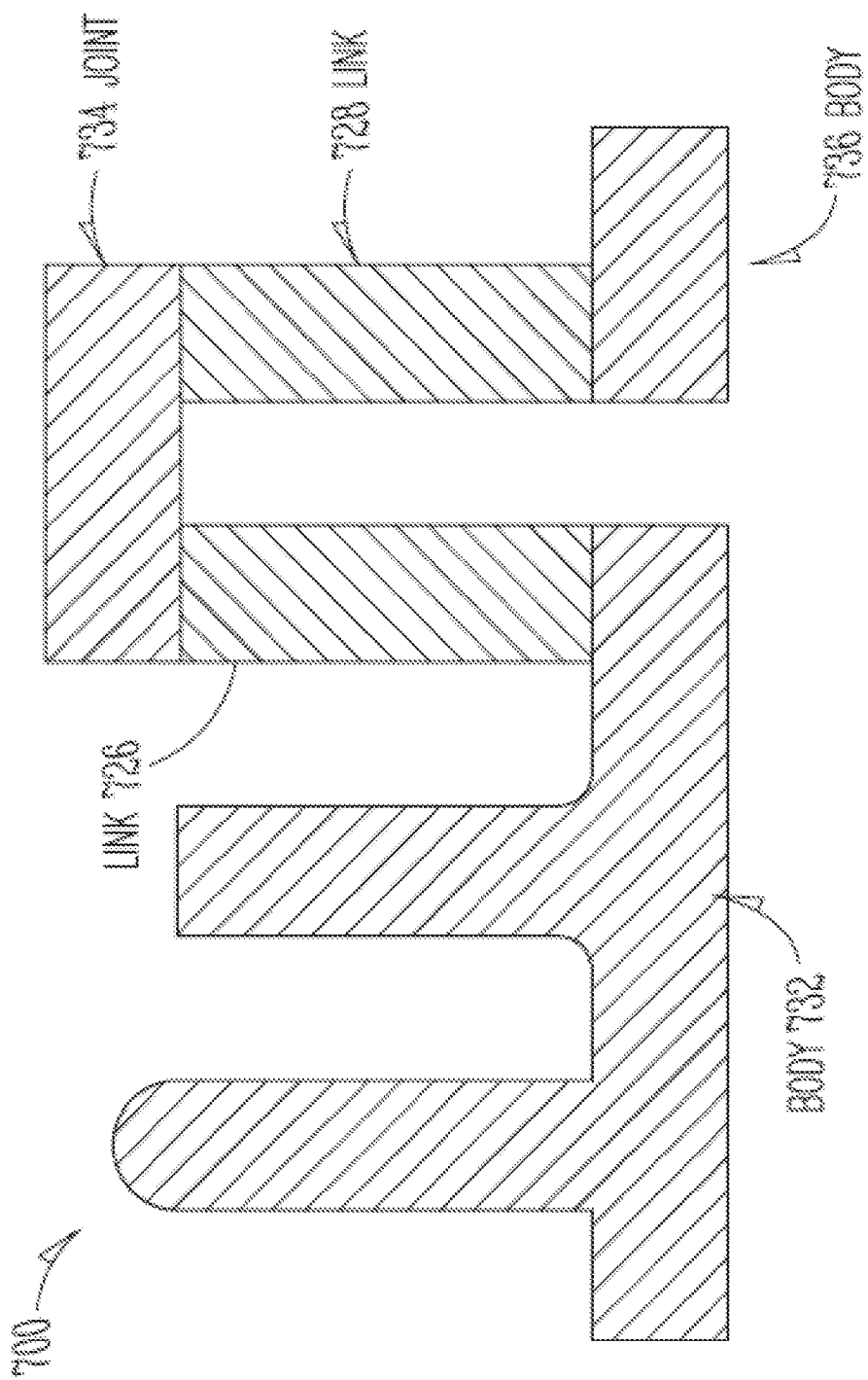

FIGS. 7B-D are diagrams illustrating MEMS structures and aspects of MEMS structure identification and extraction from a MEMS layout according to some example embodiments. FIG. 7B illustrates example inactive support 712 and active supports 714, 716, and 718 as part of a MEMS layer 700. An inactive support is a support that is adjacent to only one beam, and has an area indicating a mass that is too small to be able to exert an inertial force on a beam at acceleration rates for which MEMS device is designed to operate. In some embodiments, this means that an inactive support is defined, in certain embodiments, to be smaller than the square of any beam to which the inactive support is attached. Inactive supports are small areas that may be on the end of a finger (described below) or connecting other MEMS elements that are used to confirm that all areas of a MEMS layout have been accounted for in non-Manhattan MEMS layouts, and to consider all included material mass if an inactive support is part of a constrained mass or unconstrained mass. Inactive support 712 is a semicircle object at the end of a beam that meets these criteria. An active support is any support that is not an inactive support, and thus a wide variety of polygon shapes may be classified as active support objects. An active support object is a support object that is capable of exerting force on a beam, either as inertial force when the structure the active support is part of moves, or transmitted force directed through the active support via other elements coupled to the active support. FIG. 7B illustrates active supports 714, 716, and 718.

FIG. 7C illustrates examples of finger objects 514 and link objects 512 as part of MEMS layer 700. A link object is a beam object that is capable of bending in the MEMS layer since there can be shear force acting on it. FIG. 7C illustrates links 726 and 728, and further illustrates how a shear force pair 724, 730 can act on link 728, which would cause link 728 to bend. As these forces from shear force pair 724, 730 propagate through an implementation of a device represented by MEMS layer 700, link 728 will bend, operating as a spring as discussed in more detail further below. By contrast, finger 720 will only receive the force propagated through a device at a single end, and so one end of finger 720 will receive a single force at end 722, and the other end will receive no force at end support 721. Thus, while an inertial force may operate on a finger object, there is no shear force that will cause deformation of the finger 720. The same applies to finger 724. If inactive support 721 were larger, such that motion of finger 720 would cause deformation due to the larger mass, then finger 720 would be classified as a link, even if support 721 is not attached to any other support or beam objects.

FIG. 7D describes example body objects 516 and joint objects 518. A body object is an object that is effectively rigid and that is not deformed due to a structure of the object and/or other objects connected to a surrounding the object. A joint object is a type of body object that is positioned to transmit shear force between link objects. A joint object is thus a body object that is adjacent only to two or more parallel links. Also, a joint has an area that is less than the area of the adjacent links, and is thus unable to exert inertial force that is significant on the parallel links at acceleration rates for which MEMS device is designed to operate. As illustrated by FIG. 7D, body object 732 and body object 736 are each connected to a link object, shown as links 726 and 728 respectively. These two body objects 732 and 736, however, are not shown as connecting to a link object on their opposite ends. Object 734 by contrast is connected at one end to link 726 and the other end to link 728. Object 734 is thus capable of transmitting a shear force between links 726 and 728. Object 734 is therefore a joint object since it is effectively rigid and will not be deformed during any men's operation, and also may transfer a shear force between two links.

Figure 8:
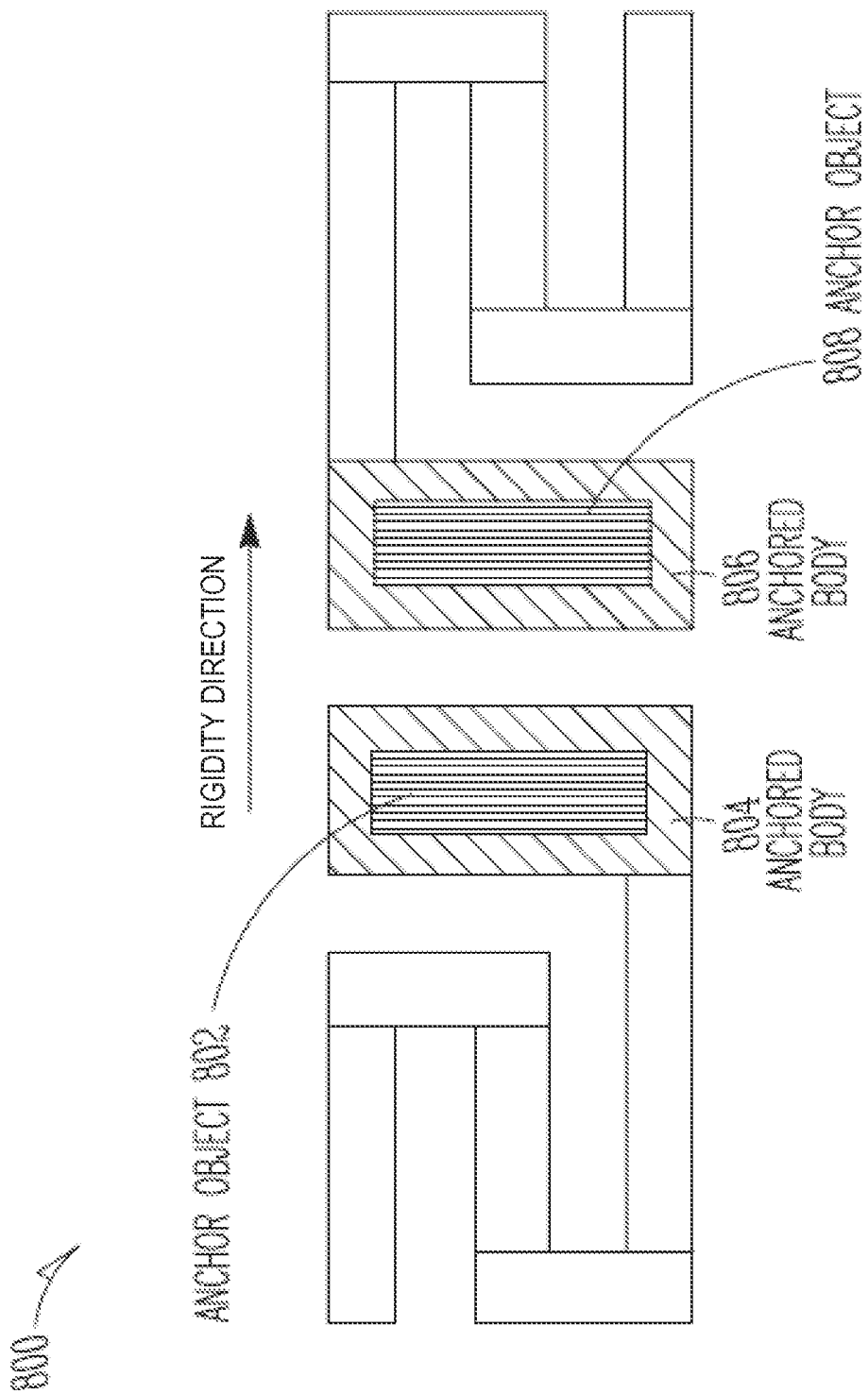
FIG. 8 is another diagram illustrating additional MEMS structures and aspects of MEMS structure identification and extraction from another MEMS layout according to some example embodiments.

FIG. 8 is another diagram illustrating additional MEMS structures and aspects of MEMS structure identification and extraction from another MEMS layout according to some example embodiments. FIG. 8 illustrates example anchored body objects 520 as part of a MEMS layout 800. An anchored body is a body object that overlaps an anchor object from an anchor layer. Anchored body objects 806 and 804 are both body objects as described above. Additionally, these objects 804, 806 overlap anchor objects 802 and 808 from an anchor layer of MEMS layout 800.

Figure 9A:
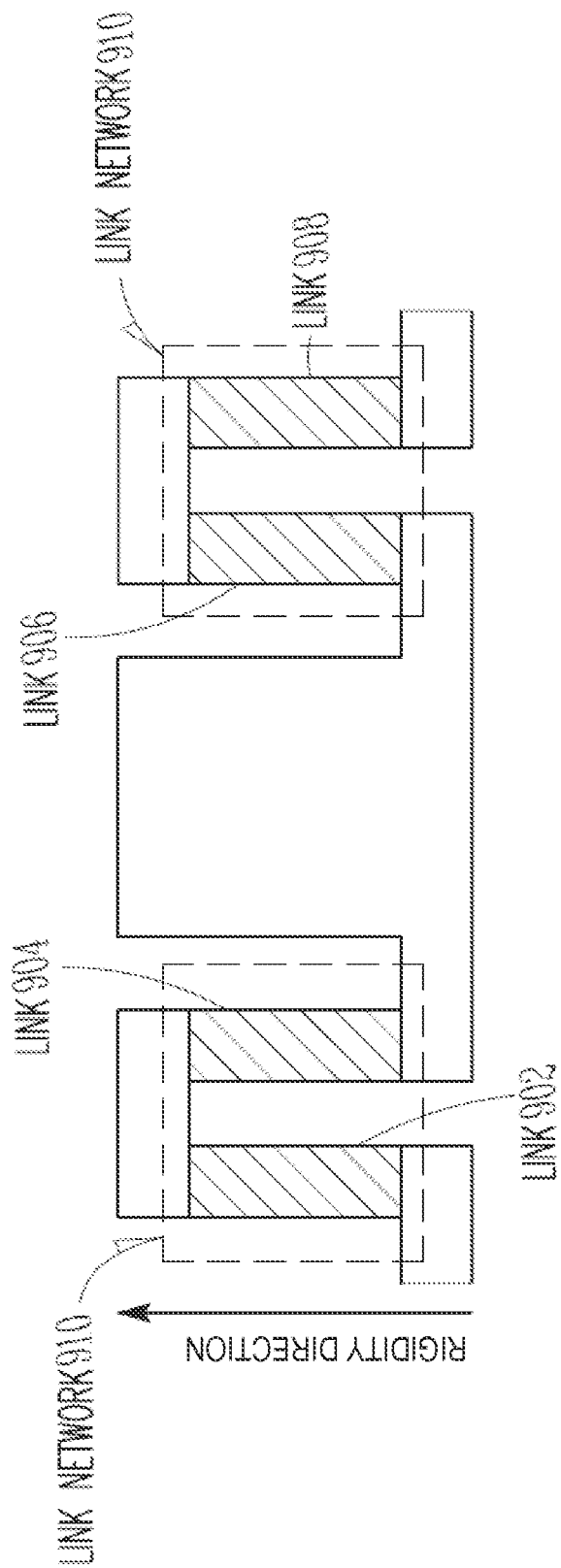
FIGS. 9A-C are diagrams illustrating additional MEMS structures and aspects of MEMS structure extraction from another MEMS layout according to some example embodiments.
Figure 9B:
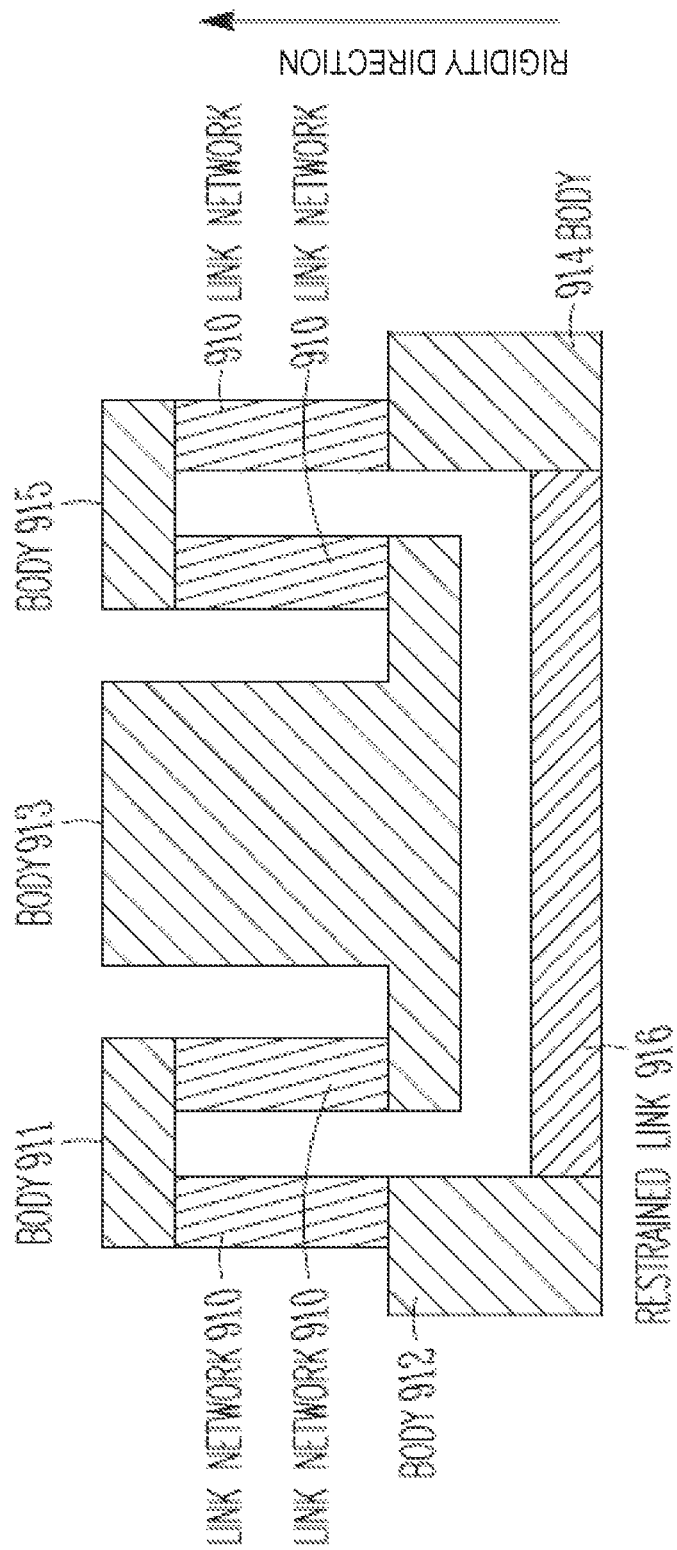
Figure 9C:
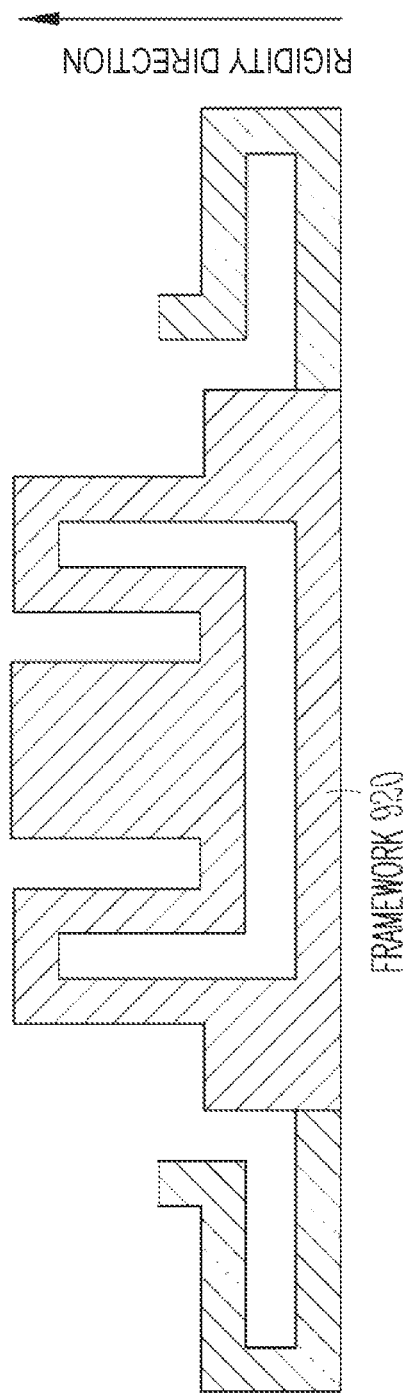

FIGS. 9A-C are diagrams illustrating additional MEMS structures and aspects of MEMS structure extraction from another MEMS layout 900 according to some example embodiments. FIG. 9A illustrates an example of link networks 522. A link network is a group of links that is effectively rigid in one direction. The links of a link network are all either directly or indirectly rigidly connected. Two links are directly rigidly connected if they are parallel and adjacent to the same body or adjacent to different anchored bodies. Two links are indirectly rigidly connected if there exists other links such that for each of the links there is another link between that is directly rigidly connected to the other link via one or more chains of rigid links. The long direction of links, as opposed to the narrow width of links, defines the rigidity direction of link network. In various embodiments, the rigidity direction may be in any direction, including at any angle with other rigidity directions for other objects within the same MEMS layer (e.g. non-Manhattan geometries are allowed). Links contained in the same link network are mutually disjoint, (e.g., not connected, non-overlapping, and non-adjacent.) Thus as illustrated by FIG. 9A, links 902, 904, 906, and 908 form link network 910 under the definition of a link network described above. The long direction of the links 902-908 is up and down according to the orientation of FIG. 9A, and the rigidity direction of the link network 910 is thus in the same direction. Force in any other direction on link network 910 will cause the links 902-908 to bend.

FIG. 9B illustrates an example restrained link objects 524. A restrained link is a link that cannot effectively bend due to the surrounding objects. Restrained link 916 by itself would bend in a direction of rigidity for link network 910. Because restrained link 916 and link network 910 are both coupled at one end to body 912 and at the other end to body 914, the orthogonal rigidity directions of these objects prevents either from moving, and the link of restrained link 916 is thus prevented from bending.

FIG. 9C illustrates an example framework object 526. A framework is a connected group of links belonging to the same link network along with any adjacent body objects and restrained links. Different frameworks can overlap if they share body objects. A framework is a group of objects that is effectively rigid in at least one direction. FIG. 9C illustrates framework 920, which comprises restrained link 916, link network 910, and bodies 911, 913, 915, 914 and 912 illustrated by FIG. 9B.

Figure 10A:
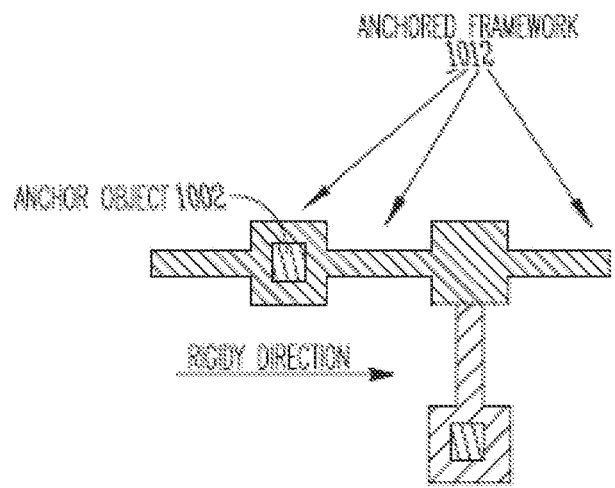
FIGS. 10A-E are diagrams illustrating additional MEMS structures and aspects of MEMS structure extraction from another MEMS layout according to some example embodiments.
Figure 10B:
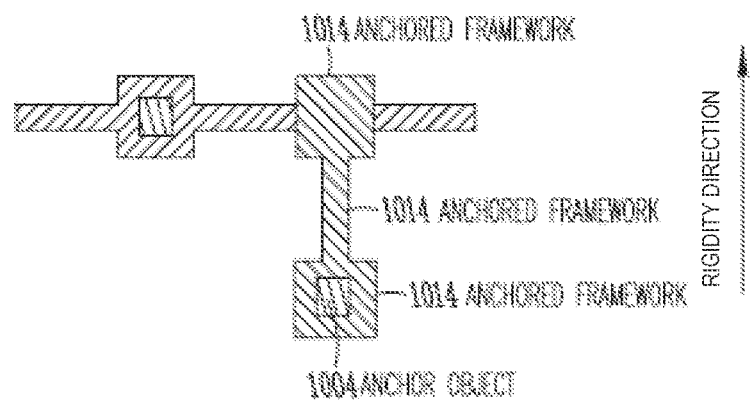

FIGS. 10A-E are diagrams illustrating additional MEMS structures and aspects of M EMS structure extraction from another M EMS layout according to some example embodiments. FIGS. 10A and 10B each illustrates an example anchored framework object 528. An anchored framework is a framework containing an anchored body, and the framework thus can only be deformed and cannot move as a whole. Different anchored frameworks can overlap if they share one or more bodies. In FIG. 10A, anchor object 1002 is shown overlapping a body, and thus the framework of anchored framework 1012 cannot move as a whole. Similarly, anchored framework 1014 shares a body with anchored framework 1012, but is a framework overlapping a different anchor object, shown in FIG. 10B as anchor object 1004.

Figure 10C:
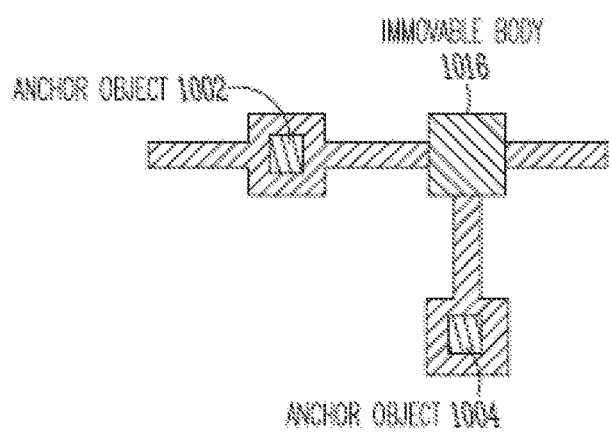

FIG. 10C illustrates an example immovable body object 530. An immovable body is a body that effectively cannot move. An immovable body is a body that is not an anchored body but that belongs to different anchored frameworks with linearly independent rigidity directions. As shown in FIG. 10A, anchored framework 1012 includes a first rigidity direction, and as shown in FIG. 10B, anchored framework 1014 includes another linearly independent rigidity direction. Because the body of immovable body 1016 belongs to both anchored framework 1012 and 1014 and is thus coupled to both anchor objects 1002 and 1004, it cannot move, and is an immovable body object type.

Figure 10D:
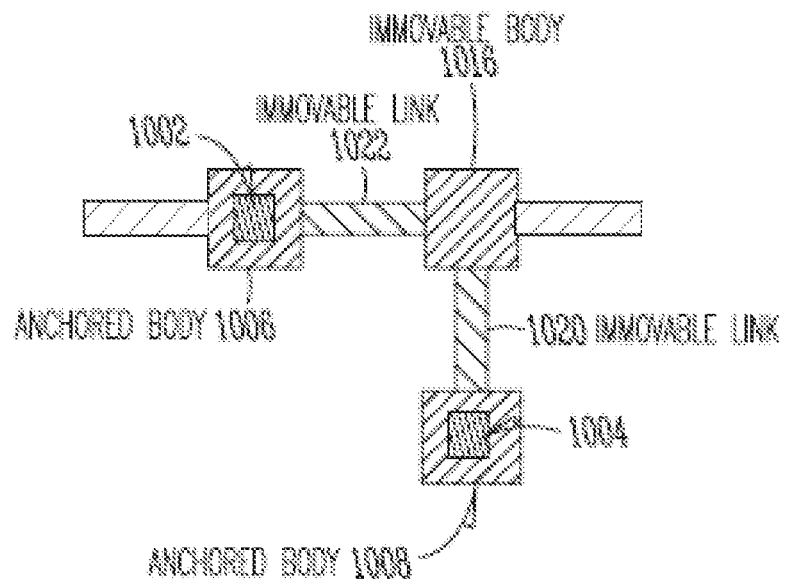

FIG. 10D illustrates examples of immovable link objects 532. An immovable link is a link that cannot bend or move (e.g., no movement with a fixed end and no translation movement through space relative to the anchor layer and substrate.) An immovable link is a link object that is adjacent to an anchored or immovable body at each end. As shown in FIG. 10D, immovable link 1022 and immovable link 1020 are each attached at one end to an anchored body (e.g., anchored bodies 1006 and 1008) and at another end to an immovable body 1016, and thus are immovable link object types.

Figure 10E:
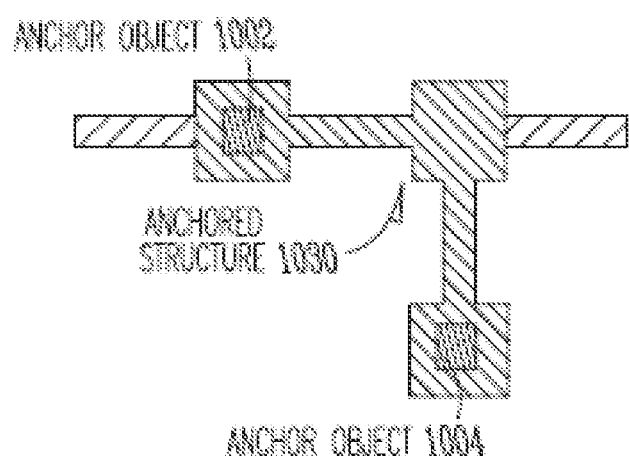

FIG. 10E illustrates an example anchored structure object 534. An anchored structure is a connected group of adjacent anchored bodies, immovable bodies, and immovable links. Anchored structure 1030 is a connected group that includes immovable links 1022 and 1020, immovable body 1016, and anchored bodies 1006 and 1008, and is therefore an object of the anchored structure type.

Figure 11A:
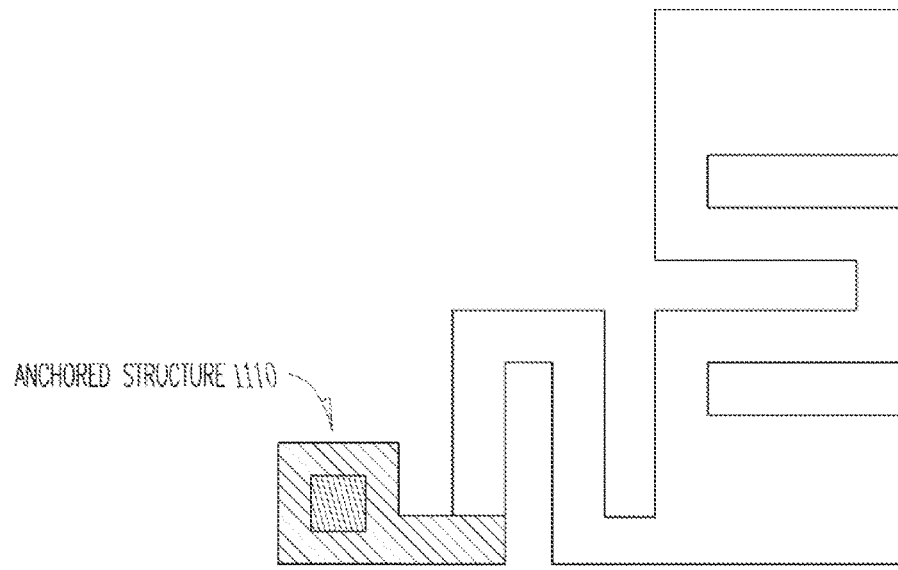
FIGS. 11A-G are diagrams illustrating additional MEMS structures and aspects of MEMS structure extraction from another MEMS layout according to some example embodiments.
Figure 11B:
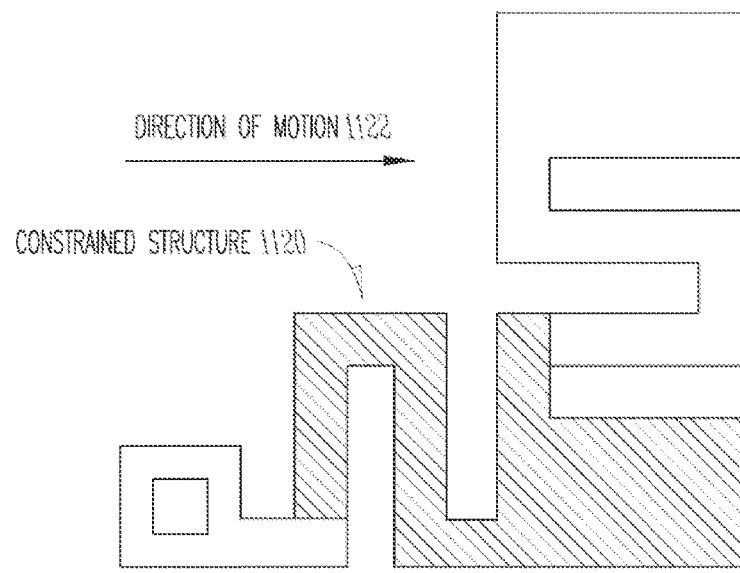

FIGS. 11A-G are diagrams illustrating additional MEMS structures and aspects of MEMS structure extraction from another MEMS layout according to some example embodiments. FIG. 11A illustrates another example anchored structure 534, shown as anchored structure 1110, and FIG. 11B illustrates an example constrained structure object 536, shown as constrained structure 1120. A constrained structure is a structure that can move in one direction. A constrained structure is a connected group of elements that belong to an anchored framework but not to an anchored structure or to the remains of an anchored framework from which any anchored structures have been removed. Illustrated by FIG. 11B, constrained structure 1120 includes a link network that is rigid in one direction and that is coupled to anchored structure 1110. This rigidity of the link network coupled with the fixed position of the anchored structure 1110 constrains the motion of constrained structure 1120 in one direction, but not in another direction. An electromagnetic or inertial force applied in the unconstrained direction can thus cause the links in constrained structure 1120 to bend, and the constrained structure 1120 to move in direction of motion 1122.

Figure 11C:
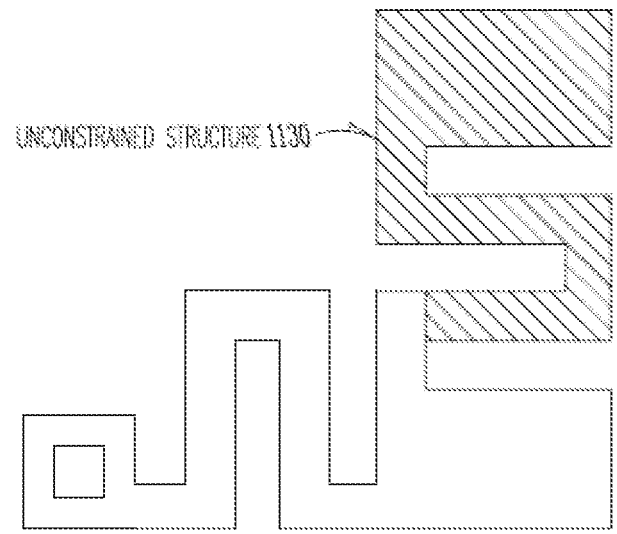

FIG. 11C illustrates an example unconstrained structure object 538, shown in FIG. 11C as unconstrained structure 1130. An unconstrained structure is a structure that can move in any direction in the plane of the MEMS layer. All movement discussed herein refers to movement in the plane of the MEMS layer as mentioned above. An unconstrained structure is a connected group of elements that belong neither to an anchored structure nor to a constrained structure. While unconstrained structure 1130 includes a rigidity direction, because it is attached to another structure that can move in this rigidity direction, and the unconstrained structure 1130 itself can move in the other direction, unconstrained structure 1130 can move in any direction.

Figure 11D:
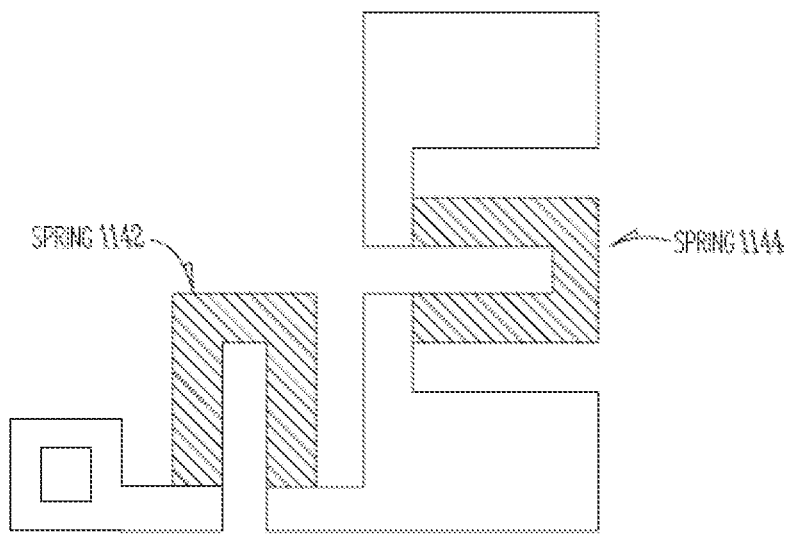

FIG. 11D illustrates examples of spring objects 540, shown here as spring objects 1142 and 1144. A spring is at least two parallel links of a link network connected by joints. As mentioned above with respect to constrained structure 1120 and unconstrained structure 1130, the parallel links include a rigidity direction, but a spring object is otherwise able to move in a non-rigid direction due to the possible deformation of beams within the spring object as force is applied. Spring object can be connected at each end to an object selected from anchored structure object type 534, constrained structure object type 536, or an unconstrained structure object type 538. Spring objects 1142, 1144 may further be used to derive internal spring objects 545 and external spring objects 543. An external spring is a spring directly coupling bodies belonging to two different structures, which may be objects selected from object types 534, 536, and 538 described above. Spring objects 1142, 1144 are examples of external spring objects. An internal spring is a spring directly coupling bodies belonging to the same structure.

Figure 11E:
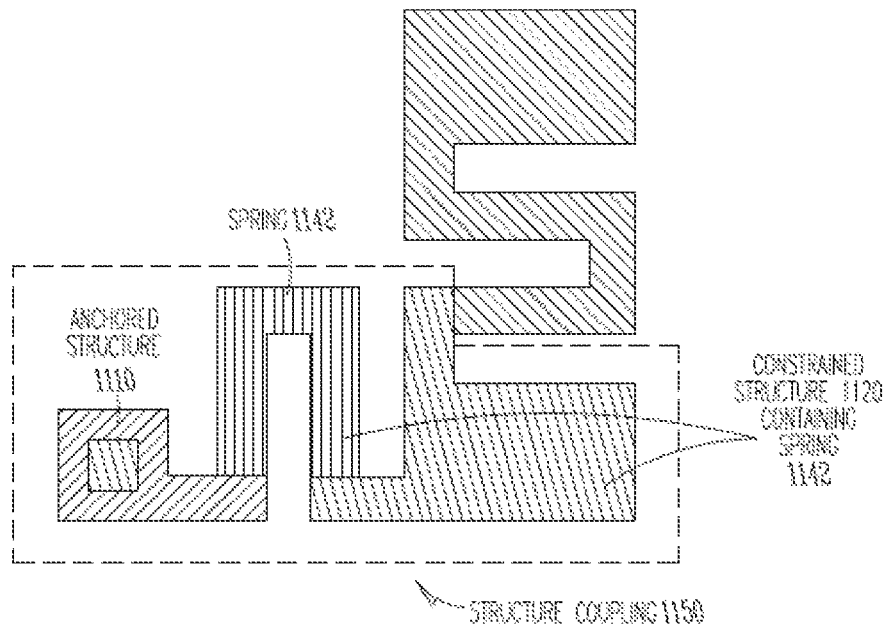
Figure 11F:
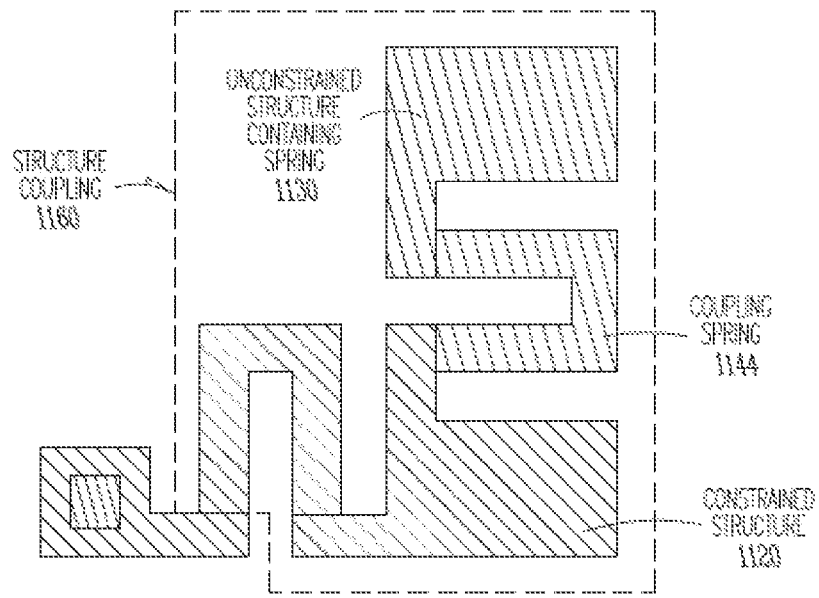

FIG. 11E then describes a structure coupling 542. A structure coupling is a group of two structures with a coupling spring that is adjacent to the bodies contained in both structures. The structures in a coupling can be anchored structure objects 534, constrained structure objects 536, or unconstrained structure objects 538. FIG. 11E illustrates structure coupling 1150, which is made up of anchored structure 1110 and constrained structure 1120 containing spring object 1142 that couples to anchored structure 1110. FIG. 11F illustrates structure coupling 1160, which is made up of constrained structure 1120 and unconstrained structure 1130 containing spring object 1144 that couples to constrained structure 1120.

Figure 12:
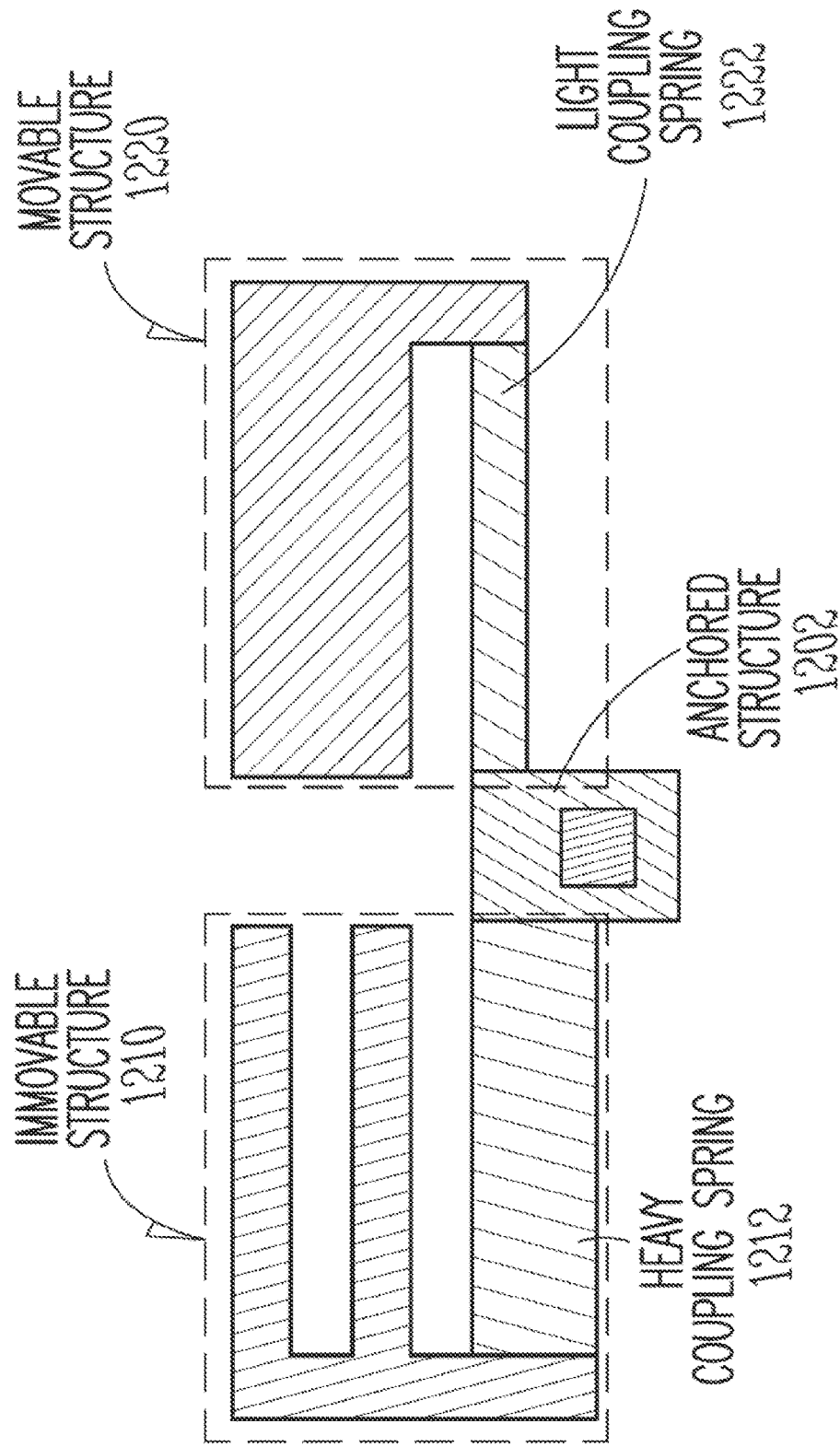
FIG. 12 is another diagram illustrating additional MEMS structures and aspects of MEMS structure identification and extraction from another MEMS layout according to some example embodiments.

FIG. 12 is another diagram illustrating additional MEMS structures and aspects of MEMS structure identification and extraction from another MEMS layout according to some example embodiments. FIG. 12 illustrates an immovable structure 546 and a movable structure 548. An immovable structure is a light constrained structure attached only to one anchored structure by a heavy coupling spring. A heavy coupling spring is a spring where the ratio of the area of the structure without the spring to the area of the spring is less that a system-defined ratio. This is similar to a finger coupled to an inactive support described above, but with a structure replacing the inactive support. A system-defined ratio may be any ratio selected by an operator input, or derived from the physical characteristics of the materials used to create a M EMS device. A heavy coupling spring is a beam or spring which couples to a structure that has a mass that is unlikely to produce large enough inertial force to enable the heavy spring to bend. By contrast, a movable structure is a constrained structure which can move, and a movable structure object 548 may be considered any constrained structure object 536 that is not an immovable structure 546.

FIG. 12 illustrates than an area of coupling spring 1212 is large relative to the entire area of immovable structure 1210, and is thus a heavy spring object 544. By contrast, an area of spring 1222 is small compared to an overall area of movable structure 1220, and so spring 1222 is not a heavy coupling spring.

Any of the object types above then describe objects which may be derived from beam object and support object MEMS elements as intermediate MEMS objects. These may then be used to derive one or more output objects, which include active spring objects 550, unconstrained mass objects 560, constrained mass objects 570, and anchored mass objects 580.

Figure 11G:
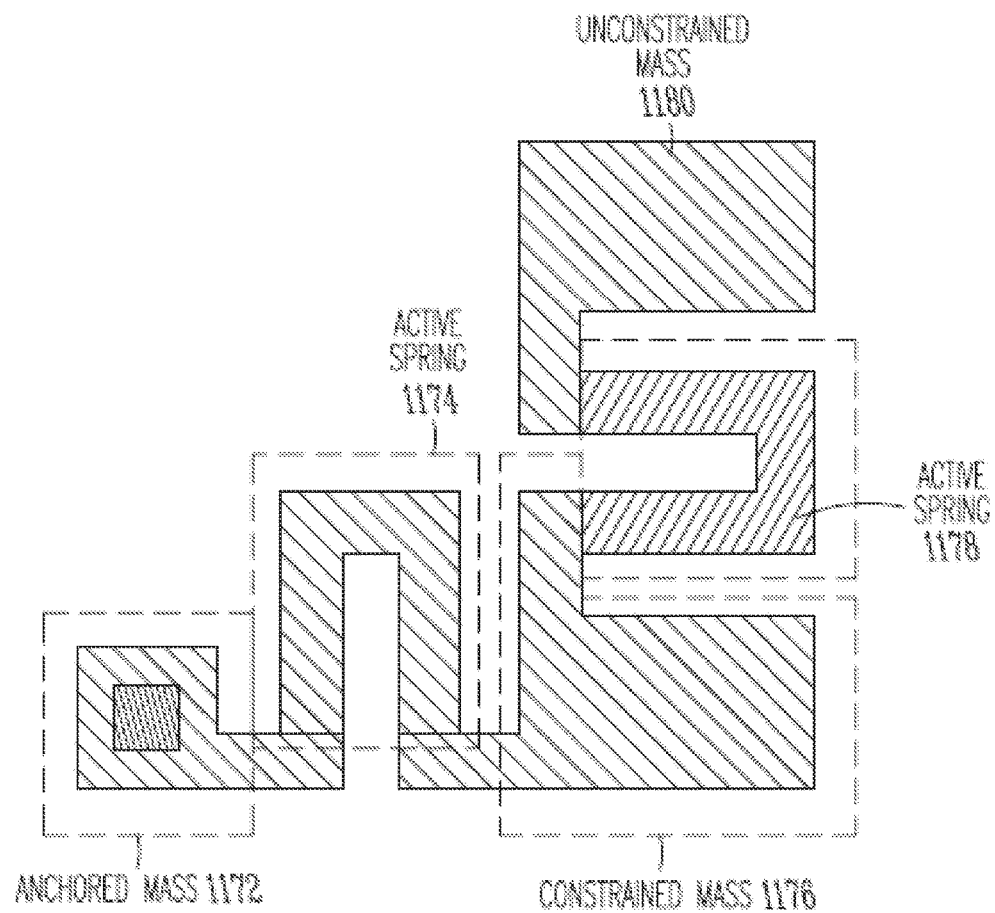

FIG. 11G is a diagram illustrating additional MEMS structures and aspects of MEMS structure extraction from another MEMS layout according to some example embodiments. FIG. 11G illustrates examples of active spring objects 550, unconstrained mass objects 560, constrained mass objects 570, and anchored mass objects 580.

An active spring object 550 is a spring that can effectively bend. An active spring object 550 may be defined as an external spring object 543 that is not a heavy spring object 544. FIG. 11G shows active springs 1174 and 1178. Springs 1142 and 1144 of FIGS. 11E and F and spring 1222 of FIG. 12 are also examples of active springs.

An anchored mass is a connected group of adjacent anchored structures and immovable structures. Anchored mass 1172 of FIG. 11G is an example of such a MEMS object. Also, in FIG. 12, the group including anchored structure 1202 and immovable structure 1210 is an anchored mass object. Similarly, in FIG. 11A, anchored structure 1110 by itself is an anchored mass object.

An unconstrained mass is an unconstrained structure from which any external springs have been removed. Unconstrained mass 1180 of FIG. 11G is an example of such a MEMS object.

A constrained mass is a movable structure from which any external springs have been removed. Constrained mass 1176 of FIG. 11G is an example of such a MEMS object. Similarly, movable structure 1220 of FIG. 12 with light coupling spring 1222 removed is a constrained mass.

In various embodiments of systems for extraction of MEMS objects, once the set of output objects is identified, attributes of these objects may be used to generate a simplified Lagrangian model as mentioned above. In certain embodiments, the mass $m_i$ of each constrained or unconstrained mass denoted by index i is calculated as $m_i = \rho A_i t$, where $A_i$ is the area of the mass, $\rho$ is the material density and t is the material thickness for an associated MEMS fabrication process and MEMS device. The direction of motion is defined for each constrained mass as the direction of motion of the constrained structure of which the constrained mass is part of. For the constrained mass 1176 this would be the direction of motion 1122 shown in FIG. 11B. For each constrained mass with index i a displacement coordinate $x_i$ is defined as the displacement of the constrained mass from its equilibrium position in its direction of motion in the plane of the MEMS layer.

The spring constant k of each active spring may be calculated as $$k = \Sigma_p [Et/4\Sigma_s (L_{ps}/W_{ps})^3], \quad (1)$$

where E is the Young's modulus of the material, t the material thickness and $L_{ps}$ and $W_{ps}$ are the lengths and the widths, respectively, of the individual links contained in the spring, with index p denoting the group of links connected in parallel and index s denoting the links connected in series within the same group.

A kinetic Lagrangian term for a constrained mass $m_i$ with displacement coordinate $x_i$ may be set as:

$$T_i = \tfrac{1}{2} m_i (dx_i/dt)^2 \quad (2)$$

A kinetic Lagrangian term for an unconstrained mass $m_i$ may be set as:

$$T_i = \tfrac{1}{2} m_i ((dx_i/dt)^2 + (dy_i/dt)^2) \quad (3)$$

where $x_i$ and $y_i$ are the displacement coordinates of the unconstrained mass from its equilibrium position in two mutually orthogonal directions.

Coriolis Lagrangian term for each unconstrained mass $m_i$ may be set as:

$$C_i = m_i \omega ((dy_i/dt) x_i - (dx_i/dt) y_i) \quad (4)$$

where ω is the angular velocity of the unconstrained mass with respect to the inertial frame of reference.

Elastic Lagrangian term for each active spring with index n and spring constant $k_n$ between an anchored mass and a constrained mass $m_i$ may be set as:

$$U_n = -\tfrac{1}{2} k_n x_i^2 \qquad (5)$$

Elastic Lagrangian term for each active spring with index n and spring constant $k_n$ between two constrained masses $m_i$ and $m_j$ with the same direction of motion may be set as $$U_n = -\tfrac{1}{2} k_n (x_i - x_j)^2 \qquad (6)$$

Elastic Lagrangian term for each active spring with index n and spring constant $k_n$ between a constrained mass $m_i$ and an unconstrained mass $m_j$ may be set as $$U_n = -\tfrac{1}{2} k_n ((x_i - x_j)^2 + y_j^2) \qquad (7)$$

where the directions of displacements $x_j$ and $y_j$ of the unconstrained mass $m_j$ from its equilibrium position are defined parallel and orthogonal, respectively, to the direction of motion of the constrained mass $m_i$.

A Lagrangian function of the system is the sum of all kinetic, Coriolis and elastic terms such that $$L = \Sigma_i T_i + \Sigma_i C_i + \Sigma_n U_n \qquad (8)$$

where L is the Lagrangian function, $T_i$ is each kinetic term, $C_i$ is each Coriolis term, and $U_n$ is each elastic term. This Lagrangian function contains information about possible direction of motion for each constrained mass and allows derivation of equations of motion describing the dynamics of the system as:

$$d(\partial L/\partial(dx_i/dt))/dt - \partial L/\partial x_i = 0 \qquad (9)$$

where index i runs over all constrained and unconstrained masses and $$d(\partial L/\partial(dy_j/dt))/dt - \partial L/\partial y_j = 0 \qquad (10)$$

where index j runs over all unconstrained masses.

Figure 13A:
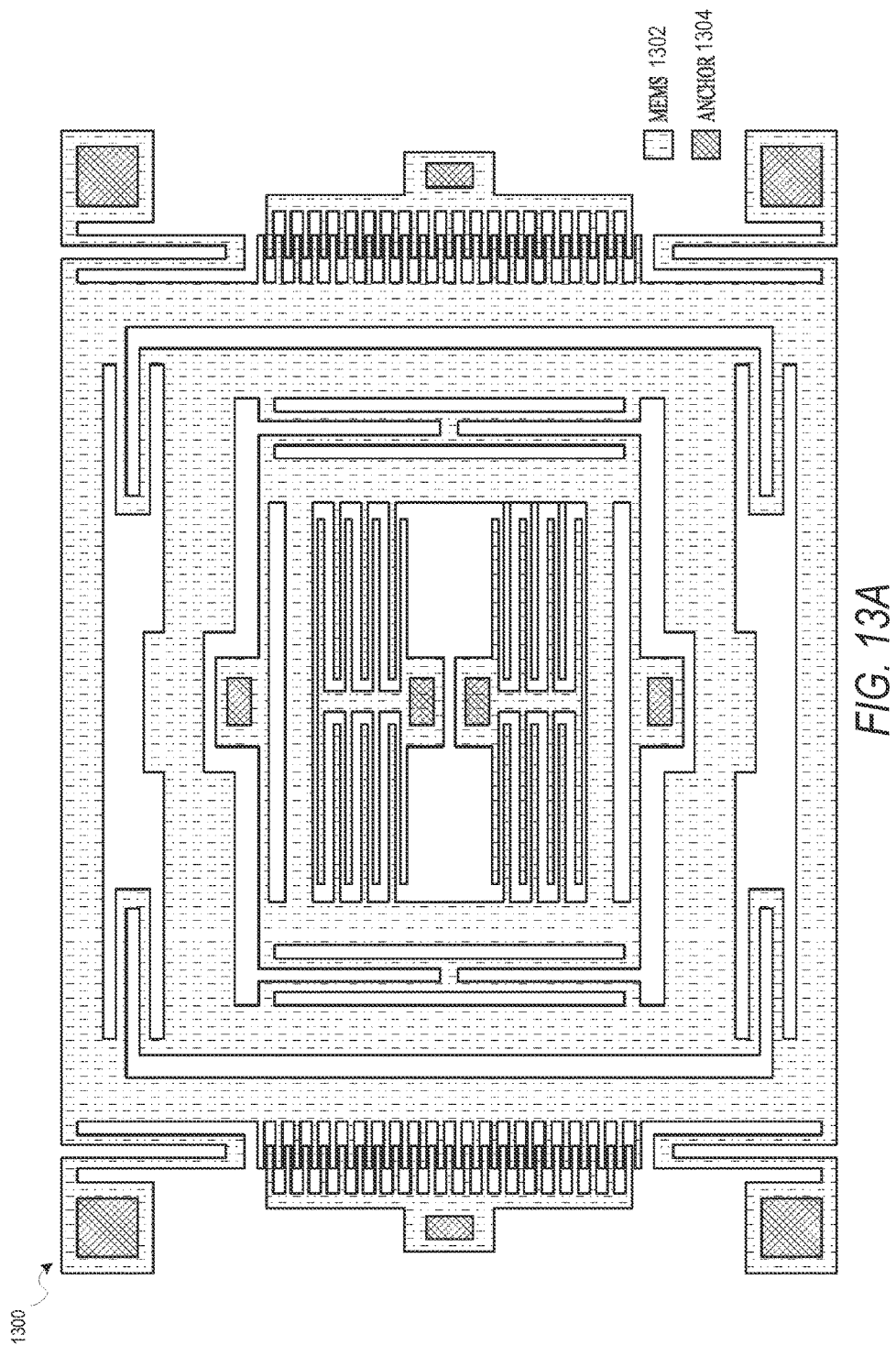
FIG. 13A illustrates another example MEMS layer according to one potential example embodiments.
Figure 13B:
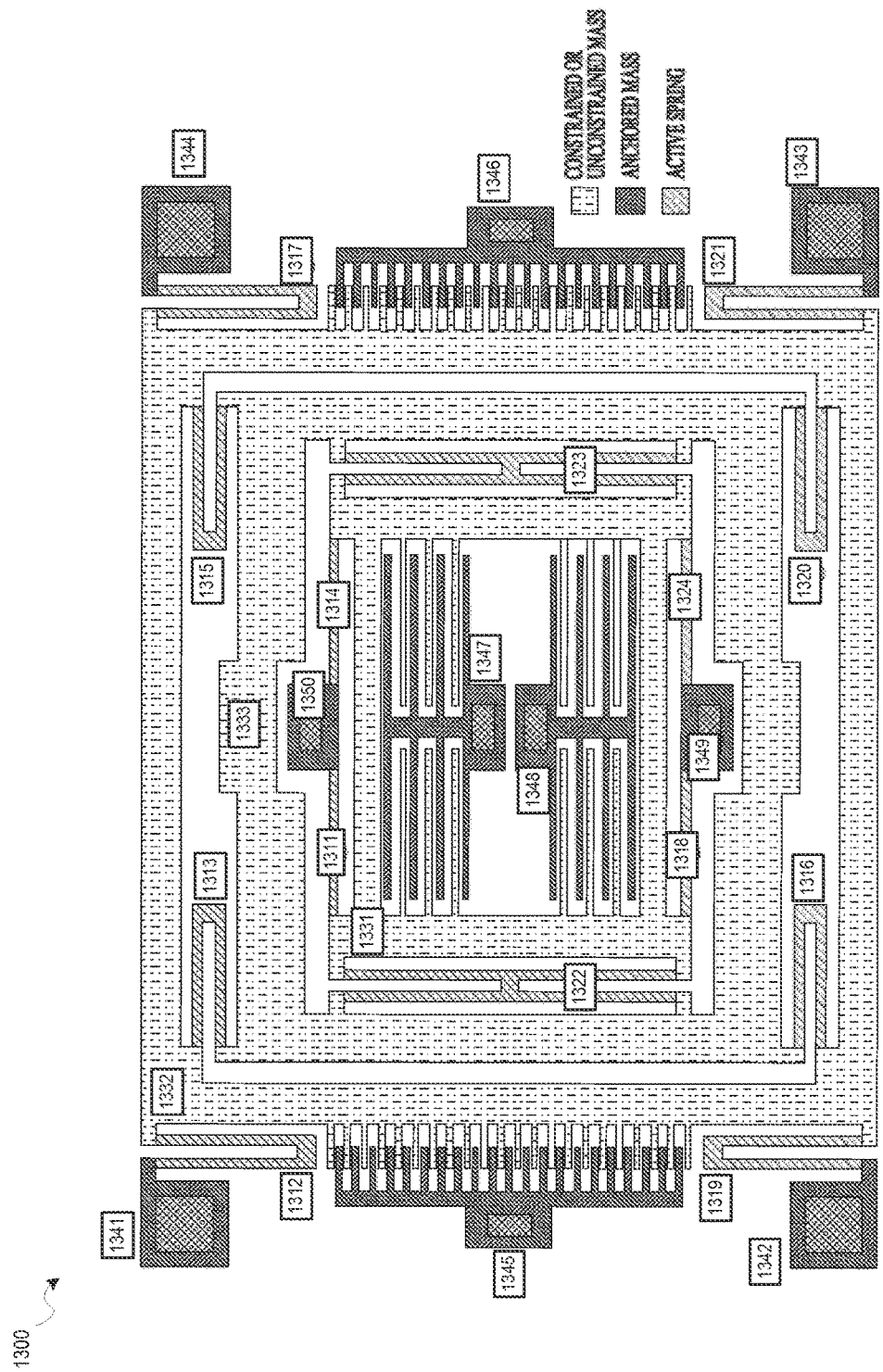
FIG. 13B illustrates a MEMS layer showing extracted MEMS output objects in accordance with some example embodiments.
Figure 13C:
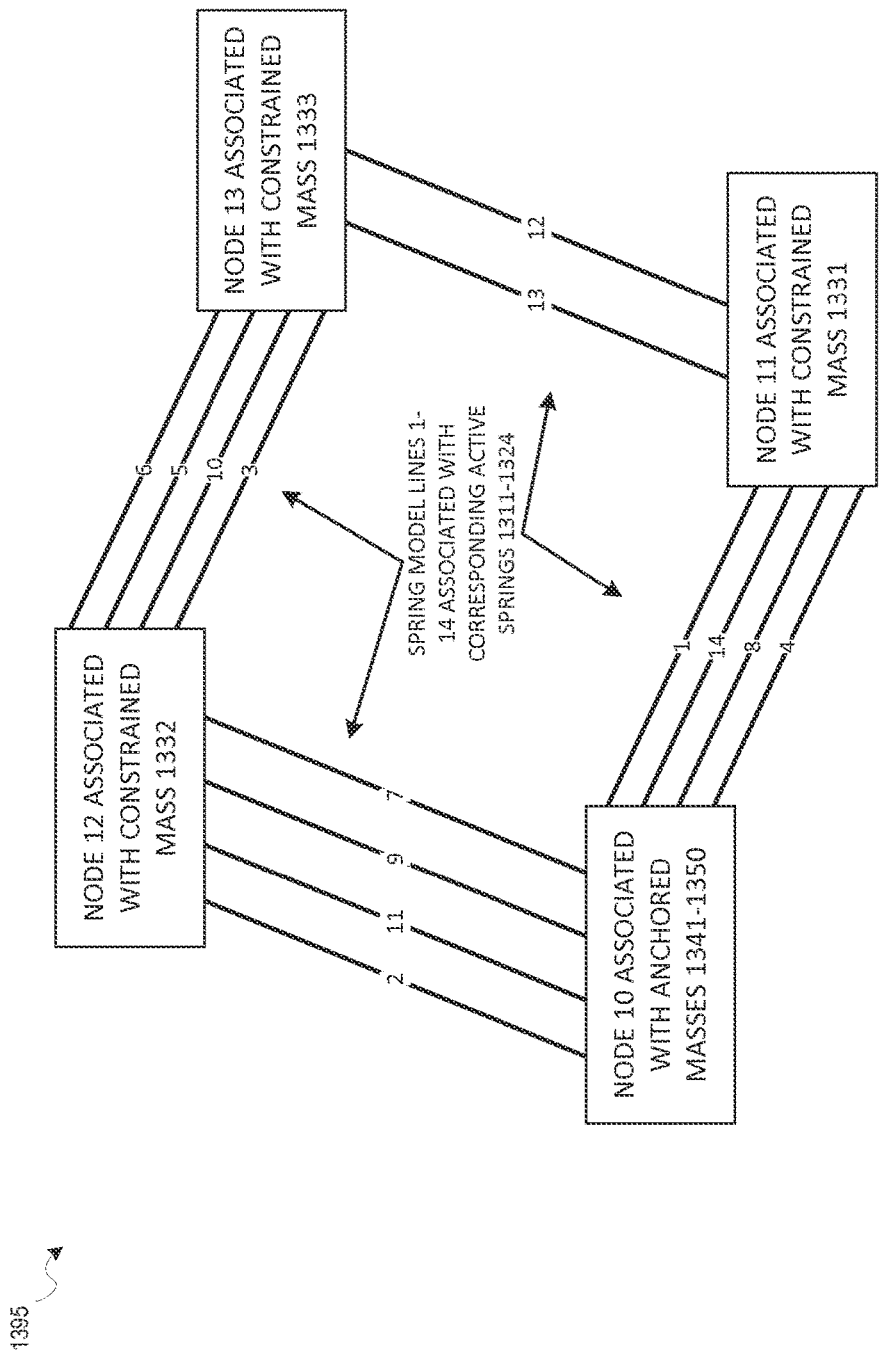
FIG. 13C illustrates a Lagrangian model using the extracted MEMS output objects from the MEMS layer in accordance with some example embodiments.

FIGS. 13A-C then represent an example MEMS layout processed by the system to extract MEMS objects, with an illustrated output MEMS layout and an associated Lagrangian model graph.

FIG. 13A illustrates another example MEMS layer according to one potential example embodiments, and shows a MEMS layout 1300 that may be accepted as an input into an embodiment for analysis as part of a design verification phase in the creation of a MEMS device. MEMS layout 1300 illustrates a MEMS layer 1302 and an anchor layer 1304 overlaid on top of each other, as shown. This MEMS layer 1302 is processed as described above to identify MEMS elements, intermediate MEMS objects, and finally a set of MEMS output objects.

FIG. 13B illustrates a MEMS layer showing extracted MEMS output objects in accordance with some example embodiments. This illustration of FIG. 13B includes an output MEMS layout 1390 showing a set of MEMS output objects derived as part of an embodiment of MEMS object extraction from a MEMS layout 1300 as described herein. The set of output objects illustrated by FIG. 13B includes active springs 1311-1324, constrained masses 1331-1333, and anchored masses 1341-1350.

FIG. 13C illustrates a Lagrangian model 1395 using the extracted MEMS output objects from the output MEMS layout 1390 in accordance with some example embodiments. A Lagrangian model graph represents a dynamic model of a MEMS layout consisting of anchored masses, constrained masses, and unconstrained masses coupled by active springs. Anchored masses coupled to the same sets of constrained and unconstrained masses are collapsed into a single model node. Each constrained mass is represented by a graph node that is associated with a mass and kinetic Lagrangian term. Each unconstrained mass is represented by a node associated with annotated mass, kinetic, and Coriolis Lagrangian terms. Each active spring is associated by a graph line between two masses, and each line is further associated with a spring constant and an elastic Lagrangian term. The Lagrangian model 1395 thus includes node 10 associated with anchored masses 1341-1350, node 11 associated with constrained mass 1331, node 12 associated with constrained mass 1332, node 13 associated with constrained mass 1333, and model lines 1-14 associated with active springs 1311-1324. This model may then be used to simulate the MEMS device operation as a lumped parameter simulation, with feedback from the simulation used to update the layout in iterations of the MEMS device design.

Figure 14:
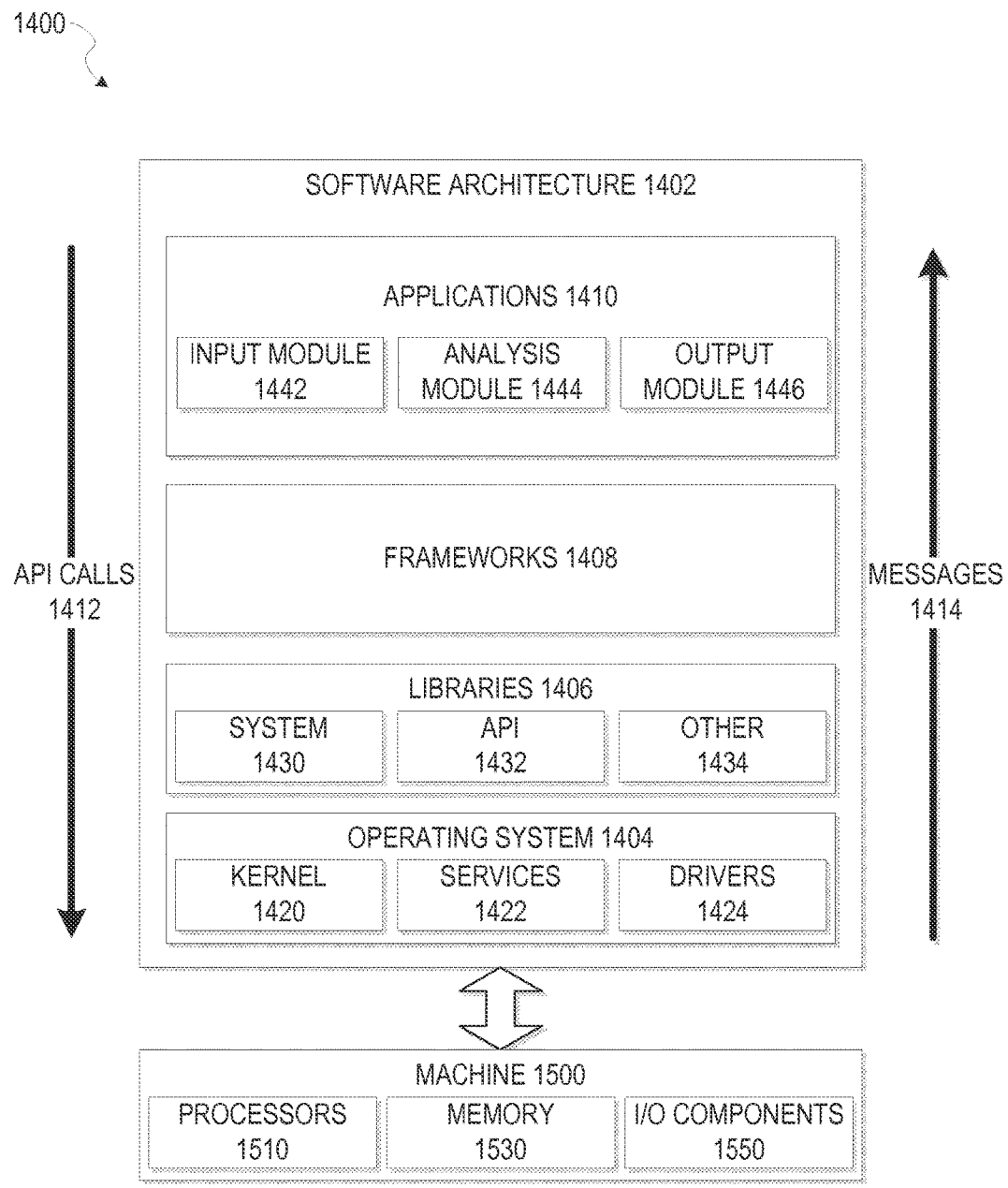
FIG. 14 is a block diagram illustrating an example of a software architecture that may be installed on a machine and used with aspects of extracting MEMS structures from a MEMS layout in accordance with some example embodiments.

FIG. 14 is a block diagram illustrating an example of a software architecture that may be installed on a machine and used with aspects of extracting MEMS structures from a MEMS layout in accordance with some example embodiments.

FIG. 14 shows is a block diagram 11f illustrating a software architecture 1402, which can be used as an electronic design automation computing device to implement any of the methods described above. Aspects of software architecture 1402 may, in various embodiments, be used to access MEMS layout data and to process the data in a design verification phase for a MEMS device. This may include implementing derivation rules within the context of a computer language such as RAVEL, or any other such computing or EDA environment. For example, in one embodiment the software architecture 1402 may include both tools for generating a MEMS layout as well as tools for implementing MEMS object extraction from the layout as described herein. This may enable independent verification that a layout to be used for manufacturing matches both the functional blocks that are expected by a designer as well as the operation that may be modeled by a Lagrangian model of the MEMS device as identified by the extracted MEMS output objects. The software architecture 1402 may also include other design and device verification tools, such as software tools for three-dimensional analysis of a modeled MEMS object that may also be modeled as a separate Lagrangian model.

FIG. 14 is merely a non-limiting example of a software architecture 1402, and it will be appreciated that many other architectures can be implemented to facilitate the functionality described herein. In various embodiments, the software architecture 1402 is implemented by hardware such as machine 1500 of FIG. 15 that includes processors 1510, memory 1530, and I/O components 1550. In this example, the software architecture 1402 can be conceptualized as a stack of layers where each layer may provide a particular functionality. For example, the software architecture 1402 includes layers such as an operating system 1404, libraries 1406, frameworks 1408, and applications 1410. Operationally, the applications 1410 invoke application programming interface (API) calls 1412 through the software stack and receive messages 1414 in response to the API calls 1412, consistent with some embodiments. In various embodiments, any client device, server computer of a server system, or any other device described herein may operate using elements of software architecture 1402. An EDA computing device described herein may additionally be implemented using aspects of the software architecture 1402, with the architecture 1402 adapted for operating to extract MEMS objects and MEMS objects as a netlist from a MEMS layout as described herein, and to generate one or more lumped parameter simulations from the extracted MEMS objects.

In various implementations, the operating system 1404 manages hardware resources and provides common services. The operating system 1404 includes, for example, a kernel 1420, services 1422, and drivers 1424. The kernel 1420 acts as an abstraction layer between the hardware and the other software layers consistent with some embodiments. For example, the kernel 1420 provides memory management, processor management (e.g., scheduling), component management, networking, and security settings, among other functionality. The services 1422 can provide other common services for the other software layers. The drivers 1424 are responsible for controlling or interfacing with the underlying hardware, according to some embodiments. For instance, the drivers 1424 can include display drivers, signal processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1406 provide a low-level common infrastructure utilized by the applications 1410. The libraries 1406 can include system libraries 1430 such as RAVEL libraries with MEMS object derivation rules or other libraries that can provide functions such as memory allocation functions, string manipulation functions, mathematic functions, and the like. In addition, the libraries 1406 can include API libraries 1432 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. In various embodiments, such libraries may be used to present a graphical representation of a Lagrangian model graph as described herein, or to show physical movement of a MEMS device predicted by a Lagrangian model described herein. The libraries 1406 can also include a wide variety of other libraries 1434 to provide many other APIs to the applications 1410.

The software frameworks 1408 provide a high-level common infrastructure that can be utilized by the applications 1410, according to some embodiments. For example, the software frameworks 1408 provide various graphic user interface (GUI) functions, high-level resource management, high-level location services, and so forth. The software frameworks 1408 can provide a broad spectrum of other APIs that can be utilized by the applications 1410, some of which may be specific to a particular operating system or platform. In certain embodiments, MEMS object extraction may be implemented as an application of applications 1410. In other embodiments, individual aspects of MEMS object extraction may be implemented as separate application modules. For example, an input module 1442 may be used to access a MEMS layout from a memory 1530, analysis module 1444 may perform both pattern recognition on the MEMS layout from memory 1530 as well as intermediate and output object derivations using rules from any combination of the analysis module 1444, software frameworks 1408, and associated libraries of libraries 1406. Analysis module 1444 may also be used to generate a lumped model of a MEMS device associated with the MEMS layout from memory 1530. Output module 1446 may be used to store an output MEMS layout in memory 1530 or to display a Lagrangian model graph on a display of the machine 1500. In other embodiments, different combinations of application 1410 modules, hardware modules, processors 1510, and other system elements may be used for MEMS object extraction.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) is configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a Field-Programmable Gate Array (FPGA) or an Application Specific Integrated Circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an Application Program Interface (API)). In certain embodiments, for example, a client device may relay or operate in communication with cloud computing systems, and may store media content such as images or videos generated by devices described herein in a cloud environment.

The performance of certain of the operations may be distributed among the processors, not only residing within a single machine, but deployed across a number of machines. In some example embodiments, the processors or processor-implemented modules are located in a single geographic location (e.g., within a home environment, an office environment, or a server farm). In other example embodiments, the processors or processor-implemented modules are distributed across a number of geographic locations.

Figure 15:
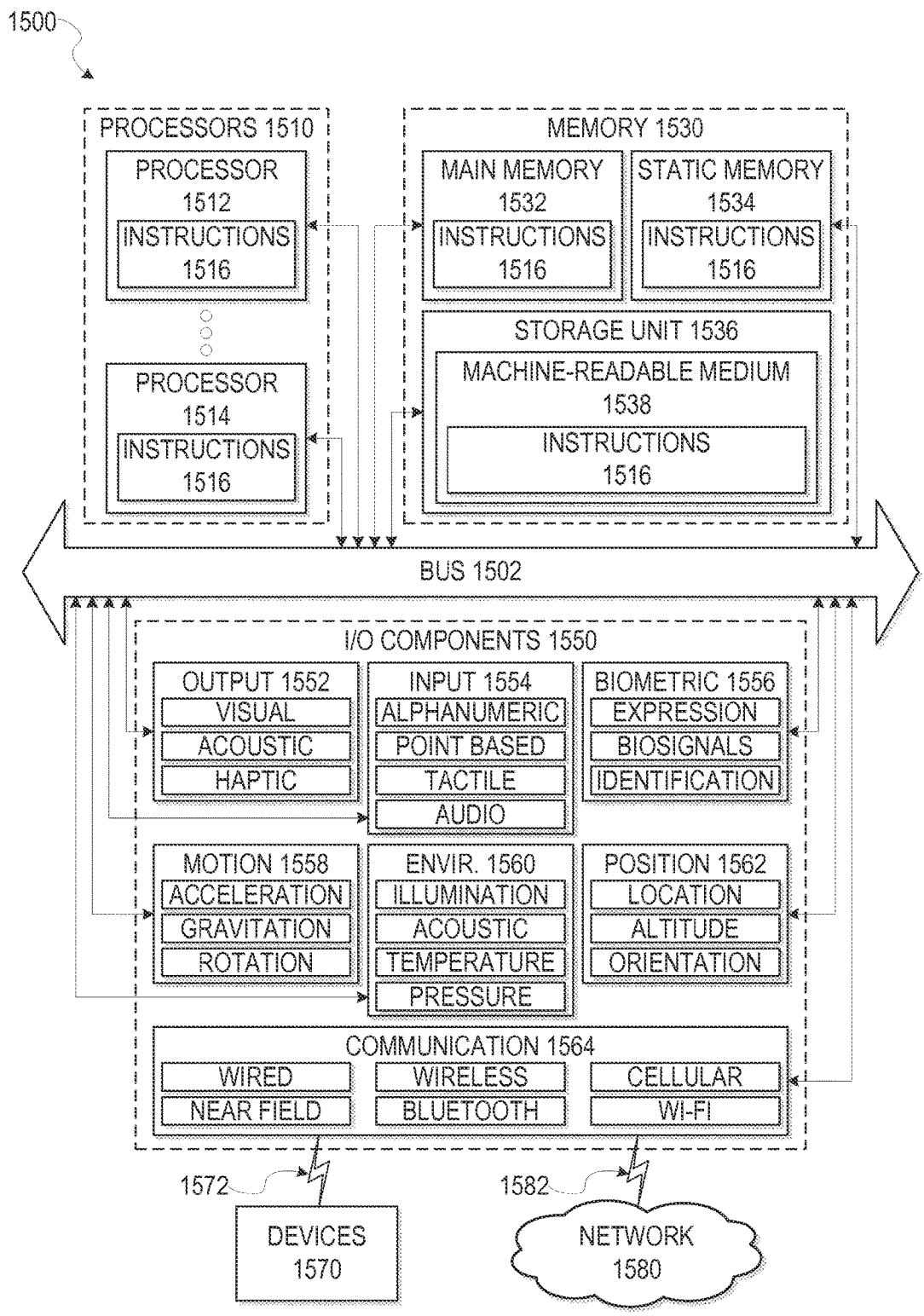
FIG. 15 is a diagrammatic representation of a machine in the form of a computer system within which a set of instructions may be executed for causing the machine to perform any one or more of the methodologies discussed herein, according to an example embodiment.

FIG. 15 is a diagrammatic representation of the machine 1500 in the form of a computer system within which a set of instructions may be executed for causing the machine 1500 to perform any one or more of the methodologies discussed herein, according to an example embodiment.

FIG. 15 is a block diagram illustrating components of the machine 1500, according to some embodiments, able to read instructions from a machine-readable medium (e.g., a machine-readable storage medium) and perform any one or more of the methodologies discussed herein. Specifically, FIG. 15 shows a diagrammatic representation of the machine 1500 in the example form of a computer system, within which instructions 1516 (e.g., software, a program, an application, an applet, an app, or other executable code) for causing the machine 1500 to perform any one or more of the methodologies discussed herein can be executed. In alternative embodiments, the machine 1500 operates as a standalone device or can be coupled (e.g., networked) to other machines. In a networked deployment, the machine 1500 may operate in the capacity of a server machine or a client machine in a server-client network environment, or as a peer machine in a peer-to-peer (or distributed) network environment. The machine 1500 can comprise, but not be limited to, a server computer, a client computer, a personal computer (PC), a tablet computer, a laptop computer, a netbook, a set-top box (STB), a personal digital assistant (PDA), an entertainment media system, a cellular telephone, a smart phone, a mobile device, or any machine capable of executing the instructions 1516, sequentially or otherwise, that specify actions to be taken by the machine 1500. Further, while only a single machine 1500 is illustrated, the term "machine" shall also be taken to include a collection of machines 1500 that individually or jointly execute the instructions 1516 to perform any one or more of the methodologies discussed herein.

In various embodiments, the machine 1500 comprises processors 1510, memory 1530, and I/O components 1550, which can be configured to communicate with each other via a bus 1502. In an example embodiment, the processors 1510 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) include, for example, a processor 1512 and a processor 1514 that may execute the instructions 1516. The term "processor" is intended to include multi-core processors that may comprise two or more independent processors (also referred to as "cores") that can execute instructions 1516 contemporaneously. Although FIG. 15 shows multiple processors 1510, the machine 1500 may include a single processor with a single core, a single processor with multiple cores (e.g., a multi-core processor), multiple processors with a single core, multiple processors with multiples cores, or any combination thereof.

The memory 1530 comprises a main memory 1532, a static memory 1534, and a storage unit 1536 accessible to the processors 1510 via the bus 1502, according to some embodiments. The storage unit 1536 can include a machine-readable medium 1538 on which are stored the instructions 1516 embodying any one or more of the methodologies or functions described herein. The instructions 1516 can also reside, completely or at least partially, within the main memory 1532, within the static memory 1534, within at least one of the processors 1510 (e.g., within the processor's cache memory), or any suitable combination thereof, during execution thereof by the machine 1500. Accordingly, in various embodiments, the main memory 1532, the static memory 1534, and the processors 1510 are considered machine-readable media 1538.

As used herein, the term "memory" refers to a machine-readable medium 1538 able to store data temporarily or permanently and may be taken to include, but not be limited to, random-access memory (RAM), read-only memory (ROM), buffer memory, flash memory, and cache memory. While the machine-readable medium 1538 is shown in an example embodiment to be a single medium, the term "machine-readable medium" should be taken to include a single medium or multiple media (e.g., a centralized or distributed database, or associated caches and servers) able to store the instructions 1516. The term "machine-readable medium" shall also be taken to include any medium, or combination of multiple media, that is capable of storing instructions (e.g., instructions 1516) for execution by a machine (e.g., machine 1500), such that the instructions, when executed by one or more processors of the machine 1500 (e.g., processors 1510), cause the machine 1500 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., Erasable Programmable Read-Only Memory (EPROM)), or any suitable combination thereof. The term "machine-readable medium" specifically excludes non-statutory signals per se.

The I/O components 1550 include a wide variety of components to receive input, provide output, produce output, transmit information, exchange information, capture measurements, and so on. In general, it will be appreciated that the I/O components 1550 can include many other components that are not shown in FIG. 15. The I/O components 1550 are grouped according to functionality merely for simplifying the following discussion, and the grouping is in no way limiting. In various example embodiments, the I/O components 1550 include output components 1552 and input components 1554. The output components 1552 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1554 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some further example embodiments, the I/O components 1550 include biometric components 1556, motion components 1558, environmental components 1560, or position components 1562, among a wide array of other components. For example, the biometric components 1556 include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 1558 include acceleration sensor components (e.g., accelerometer), gravitation sensor components, rotation sensor components (e.g., gyroscope), and so forth. The environmental components 1560 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensor components (e.g., machine olfaction detection sensors, gas detection sensors to detect concentrations of hazardous gases for safety or to measure pollutants in the atmosphere), or other components that may provide indications, measurements, or signals corresponding to a surrounding physical environment. The position components 1562 include location sensor components (e.g., a Global Positioning System (GPS) receiver component), altitude sensor components (e.g., altimeters or barometers that detect air pressure from which altitude may be derived), orientation sensor components (e.g., magnetometers), and the like.

Communication can be implemented using a wide variety of technologies. The I/O components 1550 may include communication components 1564 operable to couple the machine 1500 to a network 1580 or devices 1570 via a coupling 1582 and a coupling 1572, respectively. For example, the communication components 1564 include a network interface component or another suitable device to interface with the network 1580. In further examples, communication components 1564 include wired communication components, wireless communication components, cellular communication components, Near Field Communication (NFC) components, BLUETOOTH® components (e.g., BLUETOOTH® Low Energy), WI-FI® components, and other communication components to provide communication via other modalities. The devices 1570 may be another machine or any of a wide variety of peripheral devices (e.g., a peripheral device coupled via a Universal Serial Bus (USB)).

Moreover, in some embodiments, the communication components 1564 detect identifiers or include components operable to detect identifiers. For example, the communication components 1564 include Radio Frequency Identification (RFID) tag reader components, NFC smart tag detection components, optical reader components (e.g., an optical sensor to detect a one-dimensional bar codes such as a Universal Product Code (UPC) bar code, multi-dimensional bar codes such as a Quick Response (QR) code, Aztec Code, Data Matrix, Dataglyph, MaxiCode, PDF417, Ultra Code, Uniform Commercial Code Reduced Space Symbology (UCC RSS)-2D bar codes, and other optical codes), acoustic detection components (e.g., microphones to identify tagged audio signals), or any suitable combination thereof. In addition, a variety of information can be derived via the communication components 1564, such as location via Internet Protocol (IP) geo-location, location via WI-FI® signal triangulation, location via detecting a BLUETOOTH® or NFC beacon signal that may indicate a particular location, and so forth.

Transmission Medium

In various example embodiments, one or more portions of the network 1580 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a WI-FI® network, another type of network, or a combination of two or more such networks. For example, the network 1580 or a portion of the network 1580 may include a wireless or cellular network, and the coupling 1582 may be a Code Division Multiple Access (CDMA) connection, a Global System for Mobile communications (GSM) connection, or another type of cellular or wireless coupling. In this example, the coupling 1582 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-speed Packet Access (HSPA), Worldwide Interoperability for Microwave Access (WiMAX), Long Term Evolution (LTE) standard, others defined by various standard-setting organizations, other long range protocols, or other data transfer technology.

In example embodiments, the instructions 1516 are transmitted or received over the network 1580 using a transmission medium via a network interface device (e.g., a network interface component included in the communication components 1564) and utilizing any one of a number of well-known transfer protocols (e.g., Hypertext Transfer Protocol (HTTP)). Similarly, in other example embodiments, the instructions 1516 are transmitted or received using a transmission medium via the coupling 1572 (e.g., a peer-to-peer coupling) to the devices 1570. The term "transmission medium" shall be taken to include any intangible medium that is capable of storing, encoding, or carrying the instructions 1516 for execution by the machine 1500, and includes digital or analog communications signals or other intangible media to facilitate communication of such software.

Furthermore, the machine-readable medium 1538 is non-transitory (in other words, not having any transitory signals) in that it does not embody a propagating signal. However, labeling the machine-readable medium 1538 "non-transitory" should not be construed to mean that the medium 1538 is incapable of movement; the medium 1538 should be considered as being transportable from one physical location to another. Additionally, since the machine-readable medium 1538 is tangible, the medium 1538 may be considered to be a machine-readable device.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, techniques, instruction sequences, and computing machine program products that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
accessing an input microelectromechanical system (MEMS) layout stored in a memory of an electronic design automation (EDA) computing device, the input MEMS layout defining a MEMS layer and an anchor layer;
partitioning, by the EDA computing device, the MEMS layer into a plurality of MEMS elements, the plurality of MEMS elements comprising a plurality of beams and a plurality of supports;
identifying, by the EDA computing device, a plurality of intermediate MEMS objects derived from the anchor layer, the plurality of beams, and the plurality of supports wherein identifying the plurality of intermediate MEMS objects derived from the anchor layer, the plurality of beams, and the plurality of supports comprises: deriving a set of inactive support objects from the plurality of supports; deriving a set of active support objects from the plurality of supports and the set of inactive support objects; deriving a set of link objects from the plurality of beams; deriving a set of finger objects from the plurality of beams and the set of link objects; and deriving a set of body objects from the plurality of active supports, the set of inactive support objects and the set of finger objects;

identifying, by the EDA computing device, a set of output objects from the plurality of intermediate MEMS objects that are derived from the plurality of intermediate MEMS objects, the set of output objects comprising at least two mass objects and at least one active spring object, wherein each MEMS element is part of one output object;

generating an output MEMS layout identifying each output object of the set of output objects as part of the output MEMS layout; and fabricating a MEMS device using the output MEMS layout.

2. The method of claim 1, further comprising:

accessing a set of characteristic data associated with the MEMS layout;

identifying connections between output objects of the set of output objects;

generating a model of each mass object and each spring object; and generating a simplified Lagrangian model of the MEMS layout using the model of each mass object and each spring object.

3. The method of claim 1, wherein analyzing the MEMS layer to partition the MEMS layer into the plurality of beams and the plurality of supports comprises:

dividing the MEMS layer into a set of polygons;

identifying whether each polygon of the set of polygons is associated with a flexible element of the MEMS layout;

assigning each polygon that is associated with a flexible element of the MEMS layout to a corresponding beam of the plurality of beams; and assigning each polygon that is not associated with a flexible element of the MEMS layout to a corresponding support of the plurality of supports.

4. The method of claim 1, wherein analyzing the MEMS layer to partition the MEMS layer into the plurality of beams and the plurality of supports comprises:

identifying a set of internal edges comprising each internal edge of the MEMS layer from the MEMS layer;

identifying, from the MEMS layer, a first plurality of rectangles, each rectangle of the first plurality of rectangles comprising:

a first side consisting of at least a portion of a first internal edge of the MEMS layer;

a second side opposite the first side consisting of at least a portion of a second internal edge of the MEMS layer, wherein the second internal edge is a closest internal edge to the first internal edge, and wherein the first side and the second side are orthogonal projections of the first internal edge and the second internal edge onto each other;

a third side connecting the first side to the second side; and a fourth side opposite the third side connecting the first side to the second side;

wherein a length of the first side is a threshold amount greater than a length of the third side;

identifying, from the anchor layer and the MEMS layer, each rectangle of the first plurality of rectangles overlapping any anchor object of a plurality of anchor objects from the anchor layer;

selecting each rectangle of the first plurality of rectangles that does not overlap any anchor object of the plurality of anchor objects as a beam of the plurality of beams;

identifying each internal edge of the set of internal edges not associated with a beam of the plurality of beams; and associating each internal edge of the set of internal edges not associated with a beam of the plurality of beams with a support to identify the plurality of supports.

5. The method of claim 1, wherein analyzing the anchor layer, the plurality of beams, and the plurality of supports to identify the plurality of intermediate MEMS objects comprises:

identifying a first plurality of derived objects from the plurality of MEMS elements;

deriving the plurality of intermediate MEMS objects from the first plurality of derived objects, wherein each of the plurality of intermediate MEMS objects is derived from one or more of the first plurality of derived objects using one or more derivation operations; and wherein each output object of the set of output objects is derived from the plurality of intermediate MEMS objects using the one or more derivation operations.

6. The method of claim 5, wherein the one or more derivation operations consists of one or more of:

an addition operation where an addition resulting object type contains all elements of a plurality of addition input objects or MEMS elements;

a subtraction operation where a subtraction resulting object type does not contain all elements of a plurality of subtraction input objects or MEMS elements;

a selection operation where a selection resulting object type comprises a subset of a selection input set of objects, wherein the selection resulting object type comprises selected elements that satisfy a set of selection criteria associated with properties or relationships between the selected elements;

a grouping operation wherein a grouping output object type comprises groups of elements of the plurality of MEMS elements selecting according to a set of grouping criteria associated with properties or relationships between grouped elements; and any combination of operations above.

7. The method of claim 1, wherein identifying the plurality of intermediate MEMS objects derived from the anchor layer, the plurality of beams, and the plurality of supports further comprises:

deriving a set of joint objects from the set of body objects;

deriving a set of anchored body objects from body objects of the set of body objects overlapping a set of anchor objects of the anchor layer;

deriving a set of link networks from the set of link objects, wherein each link network comprises a plurality of mutually disjoint link objects, and wherein each link network of the set of link networks is rigid in at least one direction;

deriving a set of restrained links from the set of link objects by identifying links of the set of link objects that effectively cannot bend;

deriving a set of framework objects from the set of link networks, the set of restrained links and the set of body objects by identifying groups of connected objects that are rigid in at least one direction; and deriving, from the set of framework objects, a set of anchored framework objects that contain an anchored body.

8. The method of claim 7, wherein analyzing the anchor layer, the plurality of beams, and the plurality of supports to identify the plurality of intermediate MEMS objects further comprises:

deriving, from the set of body objects, a set of immovable body objects that belong to two different anchored framework objects of the set of anchored framework objects, wherein the two different anchored framework objects comprise two linearly independent rigidity directions;

deriving, from the set of link objects, a set of immovable link objects, wherein each immovable link object of the set of immovable link objects is connected at each end to an anchored body of the set of anchored body objects or an immovable body of the set of immovable body objects;

deriving, from the set of anchored body objects, the set of immovable body objects and the set of immovable link objects, a set of anchored structures, each anchored structure of the set of anchored structures comprising a group of adjacent anchored bodies, immovable bodies, or immovable links of the set of anchored body objects, the set of immovable body objects, and the set of immovable link objects;

identifying, from the plurality of MEMS elements, a set of constrained structures, each constrained structure of the set of constrained structures comprising a first corresponding connected group of MEMS elements of the plurality of MEMS elements that are components of an anchored framework object of the set of anchored framework objects, and wherein the first corresponding connected group of MEMS elements are not components of any anchored structure of the set of anchored structure;

identifying, from the plurality of MEMS elements, a set of unconstrained structures, each unconstrained structure of the set of unconstrained structures comprising a second corresponding connected group of MEMS elements of the plurality of MEMS elements that is not a component of any anchored structure or constrained structure of the set of anchored structures and the set of constrained structures; and deriving, from the set of joint objects and the set of link objects, a set of spring objects, each spring object of the set of spring objects comprising at least two parallel links of the set of link objects connected by at least one joint object of the set of joint objects.

9. The method of claim 8 wherein analyzing the anchor layer, the plurality of beams, and the plurality of supports to identify the plurality of intermediate MEMS objects further comprises:

deriving, from the set of spring objects and a set of structures comprising the set of anchored structures, the set of constrained structures, and the set of unconstrained structures, a set of structure couplings, wherein each structure coupling of the set of structure couplings comprises a spring object of the set of spring objects connecting two structures of the set of structures;

identifying, from the set of structure couplings, a set of external springs comprising each spring that is a component of the set of structure couplings, wherein the set of spring objects comprises the set of external springs and a separate set of internal springs;

identifying, from the set of structure couplings, a set of immovable structures, each immovable structure of the set of immovable structures comprising a constrained structure and an external spring corresponding to an associated immovable structure coupling where a ratio of an area of the constrained structure to an area of the external spring of the associated immovable structure coupling is less than a spring threshold ratio; and identifying, from the set of structure couplings, a set of movable structures, each movable structure of the set of movable structures comprising the constrained structure and the external spring corresponding to an associated movable structure coupling where a ratio of an area of the constrained structure to an area of the external spring of the associated movable structure coupling is greater than or equal to the spring threshold ratio;

wherein the plurality of intermediate MEMS objects comprises the set of spring objects, the set of structures, and the set of structure couplings, the set of immovable structures, the set of movable structures, and the set of anchored structures.

10. The method of claim 9, wherein analyzing the plurality of intermediate MEMS objects to identify the set of output objects from the plurality of intermediate MEMS objects comprises:

deriving, from the set of movable structures, a set of active springs, the set of active springs comprising external springs of the set of external springs that are components of the set of movable structures;

deriving, from the set of structures, a set of anchored masses, each anchored mass of the set of anchored masses comprising a connected group of adjacent anchored structures and immovable structures of the set of anchored structures and the set of immovable structures;

deriving, from the set of unconstrained structures, a set of unconstrained masses, each unconstrained mass of the set of unconstrained masses comprising a corresponding unconstrained structure from which a corresponding external spring of the unconstrained structure has been removed; and deriving, from the set of movable structures, a set of constrained masses, each constrained mass of the set of constrained masses comprising a corresponding movable structure from which any corresponding external springs of the corresponding movable structure have been removed;

wherein the set of output objects comprises the set of active springs, the set of anchored masses, the set of unconstrained masses, and the set of constrained masses; wherein the set of active springs comprises at least one active spring object;

wherein the at least two mass objects comprise at least one anchored mass of the set of anchored masses or at least one constrained mass of the set of constrained masses.

11. The method of claim 1, wherein each beam of the plurality of beams and each support of the plurality of supports is an element of one and only one intermediate MEMS object of the plurality of intermediate MEMS objects, and wherein each intermediate MEMS object comprises one or more MEMS elements.

12. The method of claim 1, further comprising:
identifying, from the plurality of intermediate MEMS objects, a second plurality of MEMS objects;
wherein each MEMS object of the plurality of intermediate MEMS objects is part of one and only one MEMS object of the second plurality of MEMS objects;
wherein each MEMS object of the second plurality of MEMS objects comprises one or more MEMS object of the plurality of intermediate MEMS objects; and
wherein at least one MEMS object of the second plurality of MEMS objects comprises two or more MEMS objects of the plurality of intermediate MEMS objects.

13. The method of claim 1 wherein the MEMS layer comprises non-Manhattan layout geometries; and
    wherein at least a first support of the plurality of supports comprises a non-rectangular shape.

14. The method of claim 1 wherein partitioning, by the EDA computing device, the MEMS layer into the plurality of MEMS elements comprising the plurality of beams and the plurality of supports comprises:
    identifying beam shapes within the MEMS layer having an associated aspect ratio greater than a threshold minimum aspect ratio to identify the plurality of beams; and
    identifying the remaining shapes of the MEMS layer other than the beam shapes as the plurality of supports.

15. A device comprising:
    a memory configured to store an input microelectromechanical system (MEMS) layout, the input MEMS layout defining a MEMS layer and an anchor layer; and
    processing circuitry coupled to the memory and configured to:
    access the input MEMS layout stored in the memory;
    partition the MEMS layer into a plurality of MEMS elements, the plurality of MEMS elements consisting of a plurality of beams and a plurality of supports;
    identify a plurality of intermediate MEMS objects derived from the anchor layer, the plurality of beams, and the plurality of supports;
    identify, a set of output objects from the first plurality of intermediate MEMS objects that are derived from the plurality of intermediate MEMS objects, the set of output objects comprising at least two mass objects and at least one active spring object, wherein each MEMS element is part of one output object;
    generate an output MEMS layout identifying each output object of the set of output objects as part of the output MEMS layout; and
    cause fabrication of a MEMS device using the output MEMS layout;
    wherein configuring the processing circuitry to partition the MEMS layer into the plurality of beams and the plurality of supports comprise configuring the processing circuitry to:
    identify a set of internal edges comprising each internal edge of the MEMS layer from the MEMS layer;
    identify, from the MEMS layer, a first plurality of rectangles, each rectangle of the first plurality of rectangles comprising:
    a first side consisting of at least a portion of a first internal edge of the MEMS layer;
    a second side opposite the first side consisting of at least a portion of a second internal edge of the MEMS layer, wherein the second internal edge is a closest internal edge to the first internal edge, and wherein the first side and the second side are orthogonal projections of the first internal edge and the second internal edge onto each other;
    a third side connecting the first side to the second side; and
    a fourth side opposite the third side connecting the first side to the second side;
    wherein a length of the first side is a threshold amount greater than a length of the third side;
    identify, from the anchor layer and the MEMS layer, each rectangle of the first plurality of rectangles overlapping any anchor object of a plurality of anchor objects from the anchor layer;
    select each rectangle of the first plurality of rectangles that does not overlap any anchor object of the plurality of anchor objects as a beam of the plurality of beams;
    identify each internal edge of the set of internal edges not associated with a beam of the plurality of beams; and
    associate each internal edge of the set of internal edges not associated with a beam of the plurality of beams with a support to identify the plurality of supports.

16. The device of claim 15, further comprising:
    a display device that displays an output representation of the output MEMS layout identifying each output object of the set of output objects.

17. The device of claim 16, wherein the processing circuitry is further configured to:
    identify, from the set of output objects, connections between the output objects of the set of output objects;
    generate a model of each mass object and each spring object; and
    generate a simplified Lagrangian model of the MEMS layout using the model of each mass object and each spring object; and
    wherein the display device displays an output representation of the simplified Lagrangian model of the MEMS layout.

18. The device of claim 15 wherein the MEMS layer comprises non-Manhattan layout geometries; and
    wherein at least a first support of the plurality of supports comprises a non-rectangular shape.

19. A non-transitory computer-readable medium comprising computer-readable instructions that, when executed by one or more processors, cause a device to perform operations comprising:
    accessing an input microelectromechanical system (MEMS) layout, the input MEMS layout defining a MEMS layer and an anchor layer;
    partitioning the MEMS layer into a plurality of MEMS elements, the plurality of MEMS elements consisting of a plurality of beams and a plurality of supports;
    identifying, from the anchor layer, the plurality of beams, and the plurality of supports, a first plurality of intermediate MEMS objects;
    deriving a set of anchored structures, each anchored structure of the set of anchored structures comprising a group of adjacent anchored bodies, immovable bodies, or immovable links;
    deriving a set of constrained structures, each constrained structure of the set of constrained structures comprising a first corresponding connected group of MEMS elements of the plurality of MEMS elements that are components of an anchored framework object, and wherein the first corresponding connected group of MEMS elements are not components of any anchored structure of the set of anchored structures;
    deriving a set of spring objects, each spring object of the set of spring objects comprising at least two parallel links connected by at least one joint object;
    deriving, from the set of spring objects and a set of structures comprising the set of anchored structures and the set of constrained structures, a set of structure couplings, wherein each structure coupling of the set of structure couplings comprises a spring object of the set of spring objects connecting two structures of the set of structures;
    deriving, from the set of structure couplings to identify a set of external springs comprising each spring that is a component of the set of structure couplings, wherein the set of spring objects comprises the set of external springs and a separate set of internal springs;

deriving, from the set of structure couplings to identify a set of immovable structures, each immovable structure of the set of immovable structures comprising the constrained structure and an external spring of the set of external springs corresponding to an associated immovable structure coupling where a ratio of an area of the constrained structure to an area of the external spring of the associated immovable structure coupling is less than a spring threshold ratio; and deriving, from the set of structure couplings to identify a set of movable structures, each movable structure of the set of movable structures comprising the constrained structure and the external spring corresponding to an associated movable structure coupling where a ratio of an area of the constrained structure to an area of the external spring of the associated movable structure coupling is greater than or equal to the spring threshold ratio;

determining the first plurality of intermediate MEMS objects as the set of immovable structures and the set of movable structures;

identifying, from the first plurality of intermediate MEMS objects, a set of output objects from the first plurality of intermediate MEMS objects, the set of output objects comprising at least two mass objects and at least one spring object;

generating a netlist of the set of output objects as part of an output MEMS layout; and communication with a fabrication system to fabricate a MEMS device using the output MEMS layout.

20. The non-transitory computer-readable medium of claim 19 wherein partitioning the MEMS layer into the plurality of MEMS elements comprising the plurality of beams and the plurality of supports comprises:

identifying beam shapes within the MEMS layer having an associated aspect ratio greater than a threshold minimum aspect ratio to identify the plurality of beams; and identifying the remaining shapes of the MEMS layer other than the beam shapes as the plurality of supports.

* * * * *